United States Patent [19]

Horst

[11] Patent Number: 5,287,472
[45] Date of Patent: Feb. 15, 1994

[54] MEMORY SYSTEM USING LINEAR ARRAY WAFER SCALE INTEGRATION ARCHITECTURE

[75] Inventor: Robert W. Horst, Champaign, Ill.
[73] Assignee: Tandem Computers Incorporated, Cupertino, Calif.
[21] Appl. No.: 570,937
[22] Filed: Aug. 22, 1990

Related U.S. Application Data

[63] Continuation-in-part of Ser. No. 346,203, May 2, 1989, Pat. No. 5,203,005.
[51] Int. Cl.⁵ ............................................. G06F 12/02
[52] U.S. Cl. ..................................... 395/425; 395/400; 364/DIG. 1; 365/189.03; 365/189.08; 365/230.03
[58] Field of Search ... 364/200 MS File, 900 MS File; 395/400, 425; 365/189.03, 189.08, 230.03

[56] References Cited

U.S. PATENT DOCUMENTS

| | | | |
|---|---|---|---|
| 3,913,072 | 10/1975 | Catt | 340/172.5 |
| 4,471,483 | 9/1984 | Chamberlain | 322/117 |
| 4,489,397 | 12/1984 | Lee | 364/900 |
| 4,493,055 | 1/1985 | Osman | 365/78 |
| 4,517,659 | 5/1985 | Chamberlain | 364/900 |
| 4,519,035 | 5/1985 | Chamberlain | 365/200 |
| 5,031,139 | 7/1991 | Sinclair | 395/800 |
| 5,072,424 | 12/1991 | Brent et al. | 375/189.01 |
| 5,105,425 | 4/1992 | Brewer | 371/11.1 |

FOREIGN PATENT DOCUMENTS 2128381 4/1984 United Kingdom .

OTHER PUBLICATIONS

"Chip Frame" Scheme for Reconfigurable Mesh-Connected Arrays, P. D. Franzon & S. K. Tewksbury, preprint: Proc. IFIP Int'l Workshop on WSI, 1987, 10 pages (unnumbered).
A Review of Fault-Tolerant Techniques for the Enhancement of Integrated Circuit Yield, Will R. Moore, Porceedings of the IEEE, vol. 74, May, 1986, pp. 684-698.
A WSI Approach Towards Defect/Fault-Tolerant Reconfigurable Serial Systems, Wei Chin, John Mavor, Peter B. Denyer, and vol. 23, No. 3, Jun., 1988, pp. 639-646.
Systolic System Processing Systems, edited by Earl E. Swartzlander, Jr., (Marcel Dekker, Inc., New York), 1987, pp. 299-326.
Architectures, M. J. Schute and P. E. Osman (Adam Hilger, 1986), Chapter 4.4. Pp. 169 ∝ 176, "Cobweb-A reduction Architecture."
Wafer Scale Integration, G. Saucier and J. Trilhe (Editors), Elsevir Science Publishers, 1986, pp. 255-270, "Switch Design for Soft Configurable WSI Systems" by Manolis G. H. Katevenis and Miriam G. Blatt.
Asynchronous and Clocked Control Structures for VLSI--Based Interconnection Newtworks, Mark A. Franklin and Donald F. Wann, Proceedings, 9th Symposium on Computer Architecture Apr., 1982, pp. 50-59.
An Approach to Highly Integrated, Computer-Maintained Cellular Arrays, Frank B. Manning, IEEE Transactions on Computers vol. C-26, Jun., 1977, pp. 536-552.
Wafer Scale Integration and Two-Level Pipelined Implementations of Systolic Arrays, H. T. Kung and Monica S. Lam, "Journal of Parallel and Distributed Computing," 1984, pp. 32-63.
Brighter Prospects for Wafer Scale Integration, Roger Dettmer, "Electronics and Power," Apr., 1986, pp. 283-288.

Primary Examiner—Joseph L. Dixon
Assistant Examiner—Hiep T. Nguyen
Attorney, Agent, or Firm—Townsend and Townsend Khourie and Crew

[57] ABSTRACT

A cell architecture for use in a linear array wafer scale integration includes a plurality of multiplexers, each associated with a boundary of the cell, and each selectively operable to permit ingress to and egress from function logic of the cell by neighboring cells. Each multiplexer is configured to receive and select between input and output busses from and to a neighbor cell adjacent the associated boundary. The output of each multiplexer connects to the output bus of the boundary adjacent to that with which the multiplexer is associated. When such cell architecture is used in wafer scale integration, oriented so that opposing sides of each cell are rotated 180 degrees relative to any cell at any boundary, the multiplexers can be configured to form a linear array of cells that ensures a fixed, known, delay from function logic to function logic of the cells.

29 Claims, 9 Drawing Sheets

MEMORY SYSTEM USING LINEAR ARRAY WAFER SCALE INTEGRATION ARCHITECTURE

This is a Continuation-in-Part of an earlier filed application, Ser. No. 346,203, filed May 2, 1989, now U.S. Pat. No. 5,203,005 for a LINEAR ARRAY WAFER SCALE INTEGRATION ARCHITECTURE.

BACKGROUND OF THE INVENTION

This invention is directed generally to digital systems, and in particular to a semiconductor memory system in the form of a wafer scale integrated array of substantially identically formed memory-containing cells.

Digital systems of virtually every type use some form of secondary memory (primary memory being typically random access memory that form main, cache, and other memory from which operating systems and applications programs are run). Preferred secondary memory would be semiconductor of one form or another due to such advantages as speed of operation and small size. But, due the fact that the quantity of data to be stored is often very large, that it be retained for long periods of time, and with some permanence (i.e., be impervious to power loss/outages), other forms of secondary storage are used. Often these other forms of secondary storage are of the type using magnetic media (e.g., disk or tape). The principal differences between the primary and secondary storage are two: access speed and capacity. Thus, secondary storage often provides the advantage of very high storage capacity, accompanied by the relative disadvantage of undesirable access times. This is among the reasons, as will be evident to those of ordinary skill in this art, that such schemes as virtual memory have been implemented to take advantage of the high storage capacity offered by secondary storage, while masking the relatively slow data access speeds encountered.

There have been attempts to construct secondary storage systems using solid state, semiconductor memory devices by placing more and more memory circuitry onto each chip, thereby increasing circuit size and complexity. However, as circuit size increases, the chances of flaws forming in the circuit also increases, tending to reduce the yield of useable chips from a wafer. Yet other approaches propose mechanically interconnecting integrated circuit memory devices to construct a large scale memory system. However, the necessary chip-to-chip connections in such systems which tend to reduce circuit speed, introduce noise, and give rise to reliability problems caused by mechanical failure. Also, driver circuits are often needed to provide the necessary drive current for signals that are brought off-chip, at the expense of circuit area. There are also economic considerations: Memory systems developed from multiple chips, in addition to being labor intensive, are subject to higher packaging and manufacturing costs than if implemented in fewer (or, ideally, one) chips. Thus, these latter approaches, albeit successful to an extent, are accompanied by problems that make them attractive mostly when other available forms of secondary storage (i.e., disk systems) are, for whatever reason, not acceptable for the particular application. In sum, all these, and other, reasons combine to make the prospect of a memory system capable of being formed on an entire semiconductor wafer very attractive.

Since commercial introduction of integrated circuitry, there has been a continuing trend toward putting more and more circuitry onto smaller and smaller areas of integrated circuit chips. It is not too surprising, therefore, to see that very large scale integration (VLSI) techniques are giving way to wafer scale integration as a response to the increasing demand for higher integrated circuit density. Wafer scale integration provides a large density advantage over VLSI.

Wafer scale integration seeks to assemble an entire system on a single wafer, rather than partition the wafer into chips that each carry smaller portions of a system, and thereby requires the expense of individual packaging. However, yield has been one problem that works against successful wafer scale integration. Fabrication flaws must be overcome in order to effectively and economically use wafer scale integration techniques.

There are a number of wafer scale techniques known today aimed at overcoming the yield problem. One such technique utilizes redundant copies of a digital system formed on a wafer, and provides selection circuitry integrated in each of the systems. The selection circuitry intercouples portions of each copy of the system in a manner that results in one, flaw-free, working version of the desired digital system. An example of this technique can be seen in U.S. Pat. No. 4,621,201. Other approaches can be found in W. R. Moore, "A Review of Fault Tolerant Techniques for the Enhancement of Integrated Circuit Yield," *Proc. of the IEEE*, Vol. 74, May, 1986, pp. 684-698; W. Chen, et al., "A WSI Approach Towards Defect/Fault Tolerant Reconfigurable Serial Systems," *IEEE Journal of Solid State Circuits*, Vol. 23, June, 1988, pp. 639-646; J. Trilhe and G. Saucier, "WSI—The Challenge of the Future"; *Proc. IEEE Conference on VLSI and Computers*, May, 1987. These interconnecting techniques can tend to use more wafer area, create more complex circuitry, and pose a routing problem for signal lines.

Yet another, more simplified approach, is to have bi-directional busses connecting each rectangular cell to its four adjacent neighbors. The input to the cell is selected from one of the four neighbors, and the output driven to a different neighbor. The main problem with such a structure is that every cell must have two operating neighbor cells in order to be included in a linear array or "chain" of such cells. Also, it is difficult to configure a chain in such a way that both the beginning and end are on a wafer periphery where they may be connected to bonding pads.

A more practical cell interconnection approach has been to provide separate inputs and outputs between a cell and each of its neighbors to increase interconnection flexibility. In this approach, the cell carries a logic function whose input may be selected from any one of the four neighbors, and whose output is, in turn, communicated to the selection logic associated with each boundary (which also receives inputs from each of the other boundaries). Although this structure provides sufficient paths to connect around many defective cells, there are several drawbacks: The delay between the logic functions of any two cells depends upon the number of individual selection logic elements between them. Since this is not known at the outset, the delay is unbounded. Also, the amount of logic to implement the selection logic (e.g., multiplexers) may take up a significant area of the cell, and particularly so when the information is communicated in parallel instead of bit serial form. Further, the routing of the necessary signal lines tends to be irregular and confused; since every side must connect to every other side, it is possible that interference with logic routing lines will be encountered. Further still, it is difficult to find an acceptable configuration algorithm that allows connection to any reachable cell. This and similar structures are discussed in T. Leighton and C. E. Leiserson, "Algorithms for Integrating Wafer Scale Systolic Arrays," *Systolic Signal Processing Systems,* Dekker, 1987, pp. 299-326; M. J. Shute and P. E. Osman, "COBWEB—A Reduction Architecture," *Wafer Scale Integration;* Adam Hilger, 1986, pp. 169-178; and M. G. H. Katevenis and M. G. Blatt, "Switch Design for Soft-Configurable WSI Systems"; *Proc. IFIP Int'l Workshop on WSI,* Elsevier Science Publishers, 1986, pp. 255-270.

A modification of the foregoing approach is implemented in a wafer-scale integrated memory system. Each cell carries a pair of shift registers that are used, when connected to neighbor cells, to form a spiral, consisting of a single, long shift register chain. The first half of the path through the shift register chain is formed by one of the shift registers of each cell; the return path contains the second shift register of each cell. There are two inputs to the cell from each neighbor cell; one input (from each neighbor) is multiplexed to the input of one of the shift registers, the other input (from each boundary) to the other shift register. In similar fashion the outputs of each shift register are multiplexed to one of two outputs to each neighbor. While this scheme may simplify the multiplex circuitry used in the connection techniques discussed above, it still requires more than is believed needed. Further, known implementations of the approach use a cell-to-cell connection scheme that lacks flexibility, resulting, it is believed, in a less than optimum harvest of those cells available for inclusion in the chain. (As used herein, "harvest" is used to refer to those cells that are actually included in any interconnection of the cells, relative to the number of cells on the wafer that operable.) An example of this approach is found in U.S. Pat. No. 3,913,072.

There have been also approaches that have amplified the aforementioned basic structure, adding connections to additional neighbors (hexagonal arrays—see M.J. Shute, supra) or neighbors that are not edge-adjacent (i.e., corner neighbors). These designs, however, tend to suffer from the same general problems as the rectangular approach, both offer some increased harvest at the expense of extra cell area and layout difficulties.

SUMMARY OF THE INVENTION

The present invention provides an apparatus for constructing a memory system in wafer scale integrated circuit configuration. The invention uses a simplified architecture to establish the logical connections between selected ones of a plurality of individual, substantially identically formed memory-containing cells to implement the memory system of the invention. The memory cell architecture of the present invention makes it particularly adaptable for use in a wafer scale integration of like memory cells, forming thereon an array of cells selectively interconnected in a manner that provides a number of alternate access routes to the data that may be stored in the memory-containing cells. Interconnection or configuration logic selectively allows a form of random access that heretofore was not available.

According to a preferred implementation of the present invention, a plurality of individual integrated circuit cells, each identically structured, and each carrying memory circuits, are formed on a single semiconductor wafer. Each cell is configured to have N boundaries, and each boundary is provided with an input and an output bus structure for communicating data and control (including clock) signals across the boundary and between the cells that border the boundary. Connection logic, carried by each cell, and comprising N selection circuits, each associated with a corresponding boundary, is conditioned by configuration logic of each cell to receive and select between the input and output bus structure of the corresponding boundary to selectively communicate data and control signals to or from the cell. N-1 of the connection selection circuits selectively communicate the data and control signals to the output bus structure of the boundary adjacent that with which the selection circuitry is associated. The remaining selection circuit communicates its selected input to a memory circuit carried by the cell. The output of the memory circuit connects to the output bus structure of the adjacent boundary.

Each cell is constructed to respond to a variety of instructions and data that condition it to selectively establish a cell-to-cell communication path with other of the cells for accessing the memory of each cell. Communication paths can be varied, depending upon which cells have the memory desired for access, so that only those cells necessary for the access are included. Thereby, cells not necessary to the access are not used, resulting in keeping access times at a minimum.

Each cell's memory is divided into a number of individual memory units that are capable, via utilization of the configuration circuitry, of being programmably coupled in a way that allows more than one cell to provide storage for groups of bits of a multi-bit data word. In the preferred embodiment of the invention, each cell can be configured to provide a 4-bit portion of an 8-bit data word.

Access to any cell can be initiated by signalling exterior of the cell (such as by a neighbor cell) in the form of an OPEN signal, causing the configuration logic associated with the recipient cell to select the input bus of the cell asserting such OPEN signal, and receive the control and data signals communicated thereon. Once access is made, the memory and supporting circuitry (e.g., configuration logic, etc.) carried by the cell may be tested, and if found operable the just-tested cell can then be used to gain access to one of its neighbors.

In an alternate embodiment of the invention, each cell is provided with circuitry that can allow each cell to be individually programmed to respond to commands to the exclusion of other of the cells. Groups of the memory cells can be commanded to respond, for example to a "READ DATA" command, while other of the memory cells not so commanded will disregard any such instructions. Further, certain of the memory cells can be set to respond to interconnection commands in a way that permits differing paths for instruction/data flow, in turn providing a form of random access to the memory of such cells. That is, logical connections between memory cells can be varied by programming so that only a limited number of the memory cells need be accessed rather than all, as has been done in the prior art. Thus, as will be evident upon a reading of the details of the invention set forth below, essentially only those memory cells to be accessed, together with the few needed for forming a minimum path to the accessed cells, are used to form the overall data path on the wafer.

A number of advantages flow from the cell architecture of the present invention. First, as indicated above, the circuit delay from cell to cell (or more accurately, from function logic of any one cell to the function logic of an immediately adjacent cell in any formed chain) is no longer unbounded; it is essentially four selection circuit delays per function logic.

In addition, the cell architecture of the present invention reduces the amount of logic in the signal path of the chain by being able to use a more simplified multiplexer design than that proposed by the prior art. The present cell architecture requires, to form each selection circuit, only a two-input multiplexer, whereas prior art techniques have often proposed five-input multiplexers (for a four boundary cell) and more inputs are needed when additional boundaries are proposed.

Intercell connections are less complex with the cell architecture of the present invention, resulting in less signal lines (for signal communication) and more simplified circuit layouts.

Linear array configuration using the architecture of the present invention is greatly simplified.

These and other aspects and advantages of the present invention will be readily appreciated by those skilled in the art upon reading of the following description of the preferred embodiment, which should be taken in conjunction with the accompanying drawings.

DESCRIPTION OF THE PREFERRED EMBODIMENT

Overview

The present invention is directed to a memory architecture adapted for use in the wafer scale integration scheme taught in the above-identified prior application (Ser. No. 346,203) to form a pseudo read-only addressable memory system.

Basic Cell Architecture

Figure 1:
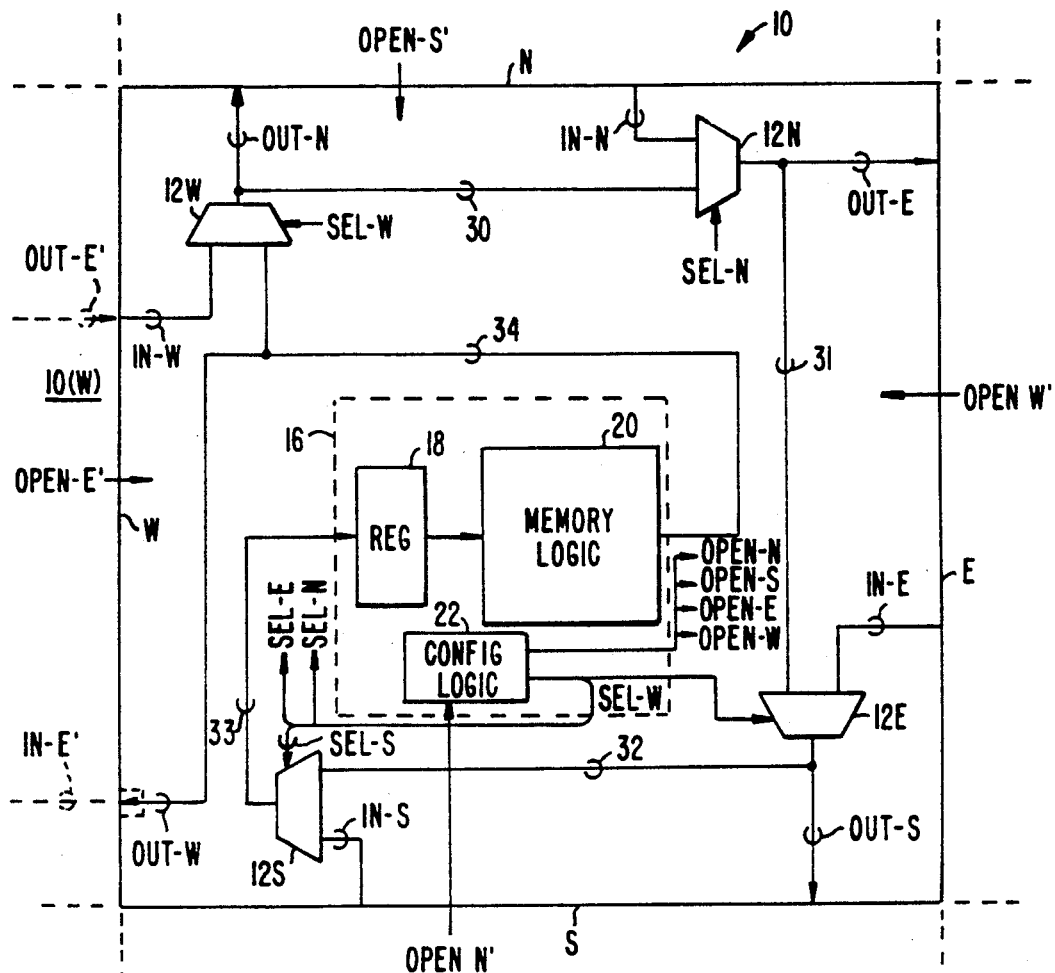
FIG. 1 is a simplified block diagram of the memory-containing cell architecture used in connection with the present invention.

Turning now to the Figures, and for the moment specifically FIG. 1, there is illustrated in simplified, block diagram form a memory-containing cell. As illustrated, the cell, designated generally with the reference number 10, is constructed to have four boundaries, each respectively labeled North (N), West (W), South (S), and East (E). (As used herein, the term boundary boundaries is intended to refer to edge portions of the periphery of a cell shared with a neighbor cell.) Associated with each of the boundaries N, W, S and E are 2-to-1 multiplexers 12N, 12W, 12S, and 12E, respectively. Also associated with each of boundaries N, . . . ,E are input and output busses IN-X and OUT-X, respectively (where X is the designation of the particular boundary N, . . . , E). Each of the IN and OUT busses of the cell 10 connect to a corresponding OUT and IN bus of an adjacent cell. Thus, for example, the neighbor cell 10(W), indicated in phantom on the boundary W of cell 10, has its corresponding output and input busses (located at what would be boundary E of the cell 10(W)), OUT-E' and IN-E' respectively connected to the IN-W and OUT-W busses of the cell 10.

It should be noted at this point that the IN and OUT busses can be structured to convey information in bit-serial format or multi-bit format. The advantages of the present invention permit information to be conveyed in parallel, multi-bit format and, therefore, this format is preferred to the bit-serial transfer of information.

The two buses, the input and output busses associated with each of the boundaries N, . . . , E are coupled to a corresponding ones of the two inputs of the selection logic, multiplexer 12, associated with that boundary. Thus, for example, the input and output busses IN-W and OUT-W associated with boundary W of cell 10 connect to corresponding inputs of the multiplexer 12W.

As FIG. 1 further illustrates, the outputs of the multiplexers 12W, 12N, and 12E associated with three of the cell boundaries (W, N and E) connect directly to the output bus of an adjacent boundary and, therefore, to one of the inputs of the multiplexer 12 associated with that adjacent boundary. The remaining multiplexer output, here multiplexer 12S, connects to the output bus OUT-W of cell 10 via a logic circuit 16, which is shown as including a pipeline register configuration 18, memory logic 20, and configuration logic 22. As shown, the output of the multiplexer 12S is communicated to an input of the pipeline register configuration 18, and from there to memory logic 20. The output of the memory logic 20 is then coupled to the output bus OUT-W of the boundary W for cell 10 and, as a consequence, to an input of the multiplexer 12W.

The memory logic 20 (as FIG. 5A will further illustrate) contains the memory circuits carried by the particular cell 10. As will be seen, the memory logic 20 includes dynamic random address memory (DRAM) circuitry, together with the necessary addressing and support circuitry for reading and writing the DRAM.

The configuration logic 22, among other things, operates to control the multiplexers 12 via selection signals SEL-W, SEL-S, SEL-E and SEL-N. The configuration logic 22 contains power-on reset circuitry (not shown) of generally conventional design that operates, when power is initially applied to the cell 10, to place it in a "closed" state in which the selection signals (SEL) cause the multiplexers 12 to de-select all IN busses. In effect, an internal loop is formed within the cell 10 by forcing the multiplexers 12 to select the associated output (OUT) busses. Thus, for example, at power-up, the multiplexer 12N is set to select and communicate the output bus OUT-N to the output bus OUT-E; the multiplexer 12E, in turn, selects and communicates the output bus OUT-E to the output bus OUT-S, and so on. The configuration logic 22 also generates four OPEN signals (OPEN_N, E, S, W) that are respectively communicated to the configuration logic of the neighbor cells at the boundaries N, E, S and W of cell 10 (e.g., cell 10(W) at the boundary W); and, correspondingly, the neighbor cells each communicate an OPEN signal to the configuration logic 22 of cell 10 (e.g., the OPEN-E' from call 10(W)). The OPEN signal from any cell adjacent the boundaries N, . . . E of cell 10, when asserted, will cause assertion of the SEL signal applied to the multiplexer associated with that boundary to select the corresponding input (IN) bus. In addition, the cell asserting the OPEN signal correspondingly causes its multiplexer associated with the intervening boundary to select the OUT bus of the cell receiving the OPEN signal.

For example, if the OPEN_N' signal (from the neighbor cell adjacent the S boundary of the cell 10) is asserted, the configuration logic 22 will, in turn, assert the SEL-S signal to cause the multiplexer 12S to select as the active input bus IN-S. At the same time, the neighbor cell asserting the OPEN_N' signal will cause its multiplexer (not shown) to select as an input the OUT-S bus from cell 10. Thus, when a boundary is "opened," it is opened for two way communication between the two cells. This concept will be discussed further in connection with the description of the memory circuit shown in FIG. 5A.

Continuing with FIG. 1, although not specifically shown for reasons of clarity, the OPEN signals generated by the neighboring cells at the E, N, and W boundaries of cell 10 (i.e., OPEN_E', S', W') are also communicated to the configuration logic 22, where they are received and used to effect selection operations (similar to that performed by the assertion of the OPEN_N' signal, described above) on the associated multiplexers 12 when asserted.

The bus structure of the IN and OUT busses, including those that may be termed an "internal bus" (i.e., bus lines 30, 31, 32, 33 and 34) of the cell 10, are preferably multi-bit, consisting of multiple signal lines, so that multi-bit data and control signals can be communicated in parallel with a clock signal.

Cell Orientation in WSI Arrays

Figure 2:
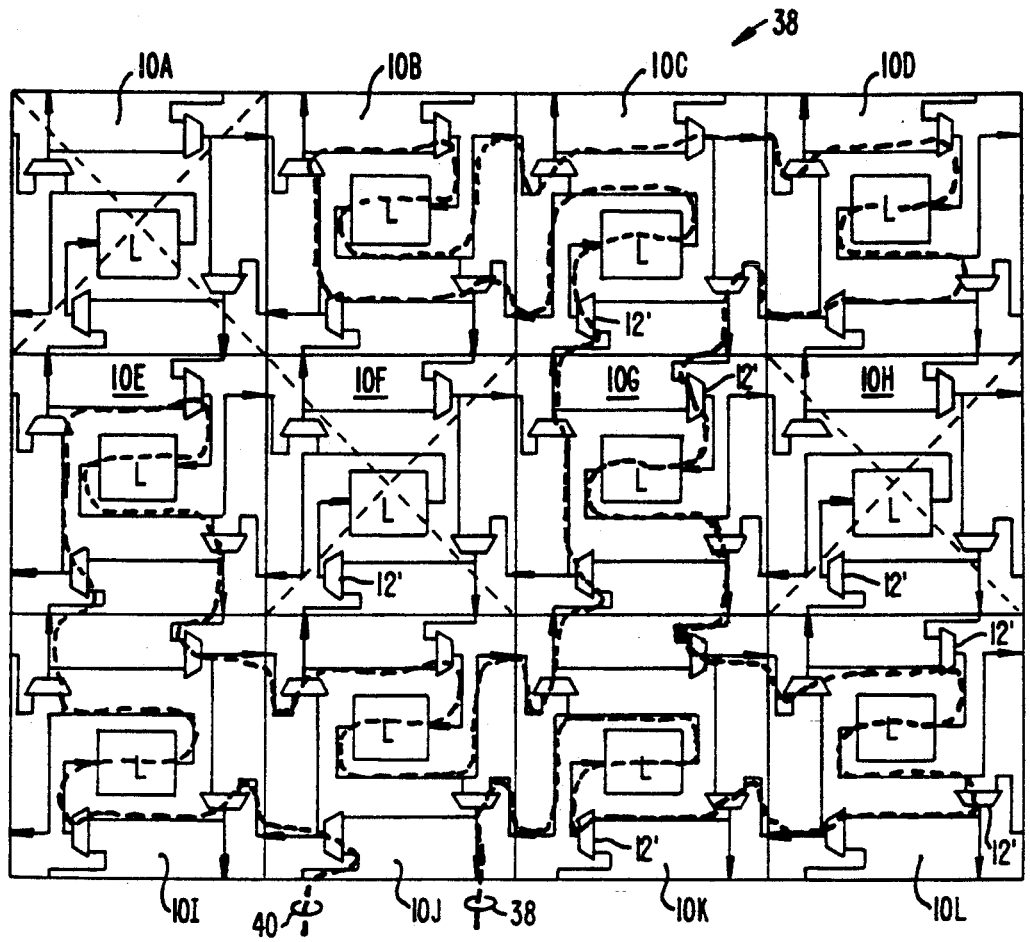
FIG. 2 is an illustration of an array of memory-containing cells forming, according to the teachings of the present invention, a wafer scale integrated memory system.

The basic architecture presented in FIG. 1 is preferably used to form an array of identical configurations of the cell 10. Each cell, however, is oriented so that it is rotated 180 degrees relative to any neighbor cell. This concept is illustrated in FIG. 2, which shows a three by four array 38 of cells 10 (10A, . . . , 10L). The cells 10 are illustrated in more simplified configuration than that of FIG. 1 for the sake of clarity.

As FIG. 2 illustrates, each cell is identically structured, along the lines of the circuit shown in FIG. 1. Thus, for example, each of the cells 10I, . . . , 10L contain four multiplexers 12' and logic circuit L.

FIG. 2 illustrates two important aspects of the basic cell construction used in connection with the present invention. The first is that when cells constructed as described are used to form an array of such cells, there is a preferred orientation of each of the cells, relative to its four principal neighbors (i.e., those neighbors on its north, south, east and west boundaries): Each cell is rotated 180 degrees relative to any adjacent neighbor. For example, referring to cell 10G, note that the multiplexer 12' that drives the logic circuit 16 is oriented to be situated in the northeastern (upper right) corner of the cell. Now, note that each of the neighboring cells 10C, 10H, 10K or 10F have the corresponding multiplexer 12' (i.e., the multiplexer driving the logic circuit L) has, in effect, been rotated 180 degrees. To put it another way, what was the N, E, S and W borders of the cell 10G become, respectively, the borders S, W, N and W when rotated 180 degrees to form any one of the cells adjacent to the cell 10G.

As will be explained more fully below, the cells of such an array 38 as illustrated in FIG. 2 are logically connected to one another by a configuration algorithm to form a number of multi-cell configurations: One single signal path that forms a linear array of the cells—such as indicated, for example, by the dotted line 40 in FIG. 2, or a "leaf" pattern, such as that illustrated in FIGS. 11A-11C (to be described in greater detail below). As FIG. 2 illustrates, the signal path, or "chain" as it is sometimes called in this art, logically connects the logic circuits L of each of the cells 10 of the chain 40 to one another in serial fashion, using appropriate selection of the multiplexers 12' of each cell. Access to any and all logic circuits L is thereby established, once the chain 40 is formed.

This latter point leads to the second important aspect illustrated by FIG. 2: Note that the signal path between any logic circuit L and the next in the chain 40 includes only four multiplexers 12' no more, and no less. This aspect of the invention establishes and makes known the signal delay between any two logic circuits 16 in the chain 40: Four multiplexer delays. Prior schemes have used multiplexing configurations that could bypass the logic circuit of any particular cells so that any number of multiplexers could be interposed between two immediately successive logic circuits, creating the unbounded situation. This required designers to design to a "worst-case" delay condition, creating much slower array operation. With known delay, array operation can be, by design, much faster.

Before continuing, it should be understood by what is meant when the term "wafer" is used herein. Although the invention is best used for forming a array 38 (FIG. 2) on an entire available surface of a wafer, it may well be that there are times that only a portion of the wafer is used for an array of cells; the remainder of the wafer may contain other circuitry. Thus, as used herein, wafer is meant to refer to a large array of cells 10 formed on a portion of the surface of a semiconductor wafer, whether or not that portion is the entire wafer surface or not.

Clocking

Since the logic circuits L (FIG. 2) most likely will be synchronous and, therefore, require clock pulses, there are a variety of methods for communicating clock to the various cells. A carefully designed clocking scheme is required to obtain good yield and performance in wafer scale integrated systems. The synchronous approach is most common, but controlling clock skew across an entire wafer is difficult, and the total skew adds directly to the cycle time. Another problem is that the clock must be carefully designed to prevent a single fault on a clock line from disabling a large number of the cells. For example, using a global clocking scheme can result in a loss of a significant number of cells if an unfortunately-located fabrication defect forms. Often, the goals of low skew and fault tolerance are at odds with each other, and compromises must be made. Most proposed schemes use a single master clock, or permit the individual cells to communicate with one another asynchronously, through the use of handshake signals. (See, for example, M. Franklin and D. Wann, "Asynchronous and Clocked Control Structures for VLSI Based Interconnection Networks," *Proc., 9th Symposium on Computer Architecture,* April, 1982, pps. 50-59.)

The asynchronous approach eliminates the need for a single controlled skew clock, but substitutes a penalty that may be even worse. A full handshake between two cells requires waiting a two-way propagation delay between the cells. Also, if the cells have internal clocks, there may be additional delays to synchronize signals to clock edges.

A preferred approach for wafer scale integrated linear arrays is to use phase-shifted synchronous clocking similar to that described by F. Manning, "An Approach to Highly Integrated Computer-Maintained Cellular Arrays," *IEEE Trans. Comput.,* Vol. C-26, June, 1977, pps. 536-552. Phase-shifted synchronous clocking is based on the premise that most communication transfers take place in a single direction, and the clock can be distributed through the same delay and configuration paths as the data. Accordingly, a diagram of a preferred clocking scheme is illustrated in FIG. 3.

Figure 3:
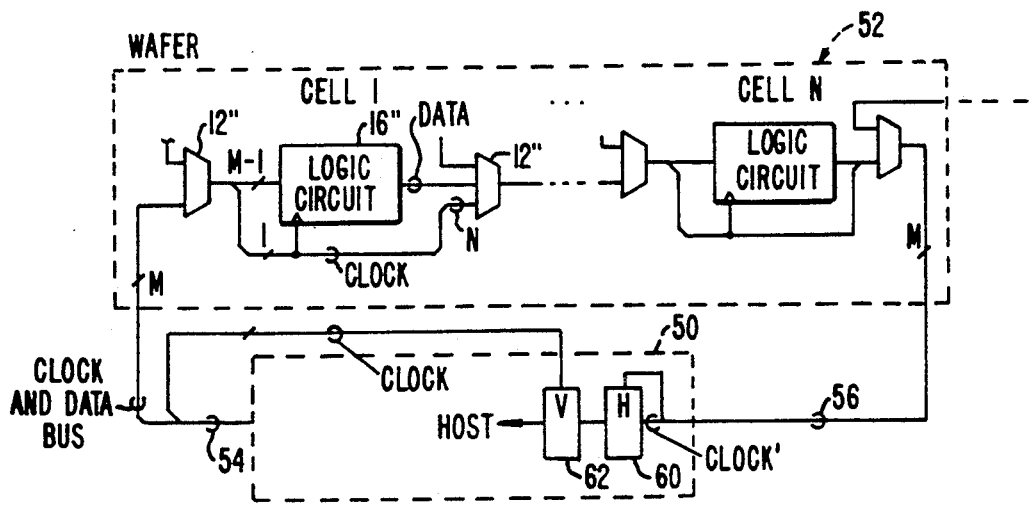
FIG. 3 is a simplified block diagram to illustrate the preferred method of communicating a clock signal to the memory-containing cells that form the present invention in accordance with the teachings herein.

As FIG. 3 illustrates, a host computer 50 generates data and clock signals that are communicated to a wafer 52 on an M-bit-wide bus 54. The wafer 52 is formed to carry an array of cells (cells 1, . . . , N) constructed according to the present invention. The clock (CLOCK) and data signals are applied to the multiplexer 12" of the first cell of the array, cell 1, and applied to the logic circuit 16" of that cell. The data from the logic circuit 16" is coupled to a multiplexer 12" of that cell 1, and selected, along with the clock signal, CLOCK, for communication through the remaining N-1 cells of the wafer 52, and returned to the host system 50 via the return bus 56. At the host, the data is applied to an input register 60, clocked by the clock signal (CLOCK') that accompanied the data. The output of the register 60 is applied to a synchronizing register (or registers) 62, clocked by the clock (CLOCK) signal that is applied to the wafer 52 by the input bus 54.

The CLOCK signal, therefore, takes the same path through the array of N cells formed on the wafer 52 as that of the data signals. Thus, the CLOCK signal is successively delayed at each cell, thereby acquiring a phase shift, relative to the CLOCK signal at the output of the host 50, that is equal to the delay through the multiplexers 12". However, when returned to the host system 50 from the last cell, N, there is no predictable phase delay between the original, host-generated CLOCK and that (CLOCK') received on the return bus 56. Accordingly, the registers 60 and 62 are used to resynchronize the clocks for receiving data by the host system 50 in conventional fashion.

The only potential problem in this scheme is that the clock pulse width may shrink or grow slightly at each stage if the rise and fall times of the buffers are not identical. A simple solution to the problem is to make the clock multiplexer/buffers inverting. Since, as explained above there are always four multiplexers in the signal path from cell to cell, the clock arrives without inversion, and asymmetries in rise and fall times at one cell are cancelled out by the next.

The net effect of the improved architecture plus the phase-shifted clocking is a gain in performance. In prior schemes, the minimum clock period is governed by $t_c$:

$$t_c \geq t_r + t_1 + t_{SKEW} + N*tMUX_{MAX} \tag{1}$$

where $t_r$ is the delay time of the (pipeline) register 18 (FIG. 1), $t_1$ is the delay of the memory logic 20, $t_{SKEW}$ is the clock skew, and $N*tMUX_{MAX}$ is the time for N cells of delay through the configuration multiplexers 12". In contrast, using the cell architecture of FIG. 1, and the arrangement of those cells in a linear array as indicated in FIG. 2, the minimum clock period is:

$$t_c \geq t_r + t_1 + 4*(tMUX_{MAX} - tMUX_{MIN}). \tag{2}$$

Note that the clock skew term has been eliminated, and the configuration delay has been reduced to four times the time difference between the minimum and maximum paths through the multiplexers. On a large wafer, the savings due to both the skew and the multiplexer delay terms could lead to a significant cycle time improvement.

Configuration Algorithm

As indicated above, a wafer scale integrated array of cells constructed in accordance with the teachings of the present invention can be configured as a single, long chain or linear array, such as that simplistically illustrated in FIG. 2. The chain is formed pursuant to an algorithm which initially locates those cells sufficiently operable to be able to pass data (and clock), and logically connects them in a chain. Generally, the algorithm proceeds, on a cell-by-cell basis, along the following lines:

First, a cell is "opened" by asserting the OPEN signal associated with a border of the cell, causing the associated multiplexer to select an IN bus (FIG. 1).

Second, multiplexers 12 and data paths within the newly opened cell are tested, and if found operable, this newly tested cell becomes the new head of the chain being formed. If, on the other hand, multiplexers 12 and/or cell data paths are found to not be operable, the border is closed (by deasserting the associated OPEN signal), and another cell is opened and the test of that cell made.

The algorithm continues until the chain returns to the cell at the periphery of the wafer 38 serving as the input/output of that wafer. For example, referring to FIG. 2, assuming the wafer comprises only cells 10A, ..., 10L, and cell 10J serves as the input/output cell, the data path chain formed by the algorithm is illustrated as the dotted line 40. It enters the wafer at the cell 10J, and proceeds sequentially through the cells 10I, 10E back through 10J, and continues through cells 10G, 10B, ..., 10K, returning to the cell 10J where it is taken from the wafer 38 of our example.

The test performed by the algorithm may be limited, as referred to above, to determining whether the cell has the data-communicating ability (i.e., workable multiplexers and data paths) to be included in the chain. Once the chain is formed, a second testing procedure can be made to determine the operability of the other logic circuitry L (e.g., the pipeline registers 18 and the memory logic 20 of FIG. 1). Alternatively, the initial cell test could be to determine the working condition of the entire cell.

Before going into the configuration algorithm in more depth, there are additional features of the cell 10 used in configuring the chain which need explanation. Contained in the configuration logic 22 (FIG. 1) are various registers and latches that are set or reset to indicate various operating states, modes of operation, etc. The information provided by the configuration logic 22 includes assertion of the CHAIN signal (not shown) to indicate that the particular cell is a part of the chain. A cell is not opened if this signal is asserted.

When each cell is opened, tested, and found to be operable, it forms the head of the developing chain, signified by a "token" being advanced (e.g., moved) into that newly tested cell by setting a one of four latches (e.g., 161/162, FIG. 5b) of the cell. The token indicates which border of the cell was opened and crossed to bring the chain in; it also designates the border adjacent the one crossed that will be opened and crossed for access into the next cell to be checked (i.e., the adjacent border, in a clockwise direction, from the entry border). The latch that is set, therefore, identified the particular corner of the cell that is (1) immediately adjacent to the boundary crossed by the chain for ingress to the cell and (2) the first boundary to be checked for the next cell selected for progression of the chain. These latches are cleared by the power-up circuit (not shown) contained in the configuration logic 22 (FIG. 1).

One final point: Advancing the token does not necessarily mean that the chain, as it is constructed, will always proceed from a newly-tested cell into an untested cell. Rather, the token could well be advanced into an already tested cell, such as indicated in FIG. 2 where path 40 is shown beginning at cell 10J, proceeding through cell, 10I and into cell 10E. Cell 10E is, however, bounded by the wafer periphery, and two inoperable cells 10A and 10F (so indicated by the Xs drawn thereacross in phantom). The algorithm, as will be seen, checks first to see if the "target" cell (i.e., the cell next in line for possible inclusion in the chain) is, in fact already a part of the chain, and if the boundary between them (the target cell and the newly tested cell, presently holding the token) is open (when a boundary is opened, it is opened both ways). If so, the token is advanced into the target cell, even though it is already in the chain. This is the case shown in FIG. 2, where the path 40 returns from the cell 10E to cell 10I, and from there to cell 10J. There are other instances of this concept shown in FIG. 2.

Figure 4A:
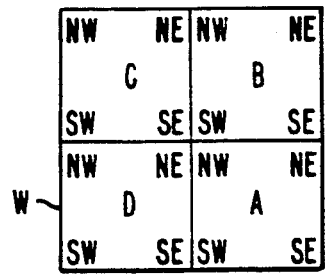
FIG. 4A is a diagrammatic array of four memory-containing cells, used to illustrate a technique of sequential logic interconnection of cells by a simple configuration algorithm.
Figure 4B:
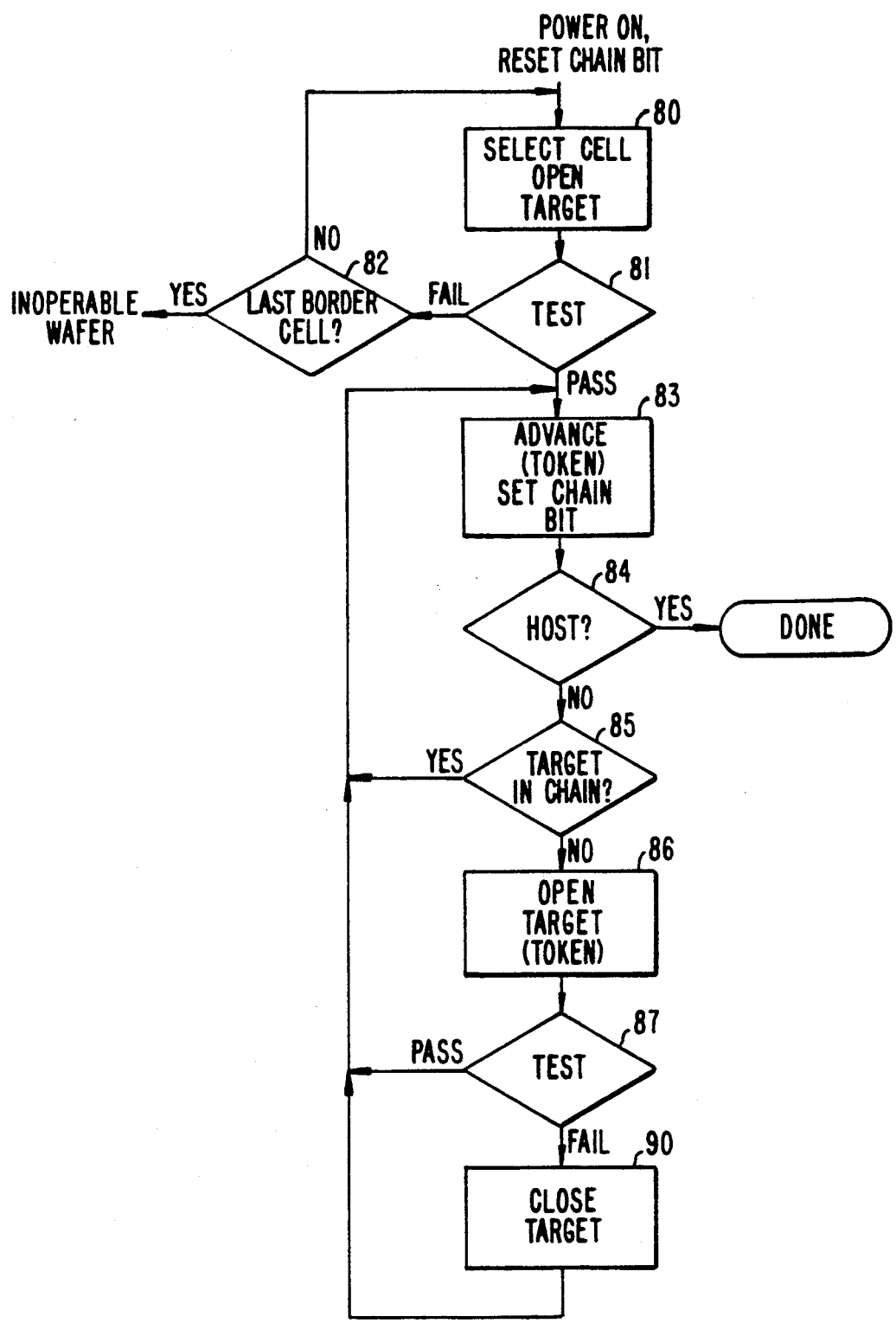
FIG. 4B is a flow chart illustrating, in simplified form, the major steps taken to initially configure a linear array of memory-containing cells constructed in accordance with the teachings of the present invention for testing.

The configuration algorithm, the main steps of which are illustrated in FIG. 4B, proceeds along the following lines: Applying power to the wafer will cause any informational latches contained in the configuration logic 22 of each of the cells 10 to be reset, ensuring that various signals of the cell (e.g., the token and CHAIN signals) are deasserted. Referring to FIG. 4B, the algorithm next proceeds to the step 80, where a periphery cell is selected by the host computer 50 running the algorithm. The cell ("target") is opened by assertion of an OPEN signal associated with the particular boundary, causing the corresponding multiplexer 12 to select as an input the IN bus associated with that boundary.

Next, in step 81, the cell is tested. If it is found to be operable, the algorithm advances to step 83. If, on the other hand, the cell is defective in some way, step 81 is followed by step 82, where a determination is made as to whether the just failed cell is the last peripheral cell of the wafer tested. If not, steps 80 and 81 are repeated until a workable cell is found. If no workable cell can be found at the periphery of the wafer, the wafer is determined to be bad, and the algorithm ends.

Assuming that steps 80 and 81 do find a peripheral cell that is operable, step 83 of the algorithm is performed: The "token" is advanced into that cell by setting a latch or other memory device of the configuration logic 22, corresponding to the cell's boundary entered, and signifying that the cell is now included in the chain by asserting the CHAIN signal.

For example, with reference to FIG. 4A, which can be thought of as showing a portion 68 of a larger wafer, consisting of four cells A, B, C, and D, each configured in accordance with the teachings of the present invention, and oriented as discussed with respect to FIG. 2 (i.e., each cell is rotated 180 degrees relative to any neighboring cell). Assume the cell D has just been entered, tested, and found to be in working order by the steps 80 and 81. The token is advanced into the cell by causing the configuration logic 22 to assert the NW signal, signifying that the chain being formed entered the boundary (here, W) counterclockwise adjacent to the NW corner of the cell D. The NW signal also signifies the next target cell: The cell adjacent the boundary immediately clockwise from the NW corner.

The algorithm then will cause the configuration logic 22 to identify the cell D as now being part of the chain. At step 84, a check is made to determine if the chain has progressed back to the host. If so, the algorithm is exited. If not, step 85 is performed to see if the next cell nominated for inclusion into the chain is, in fact, already in the chain (as indicated by the target cell's asserted CHAIN signal). For example, referring again to FIG. 4A, as indicated above, the target cell of the chain is now cell C. Before the OPEN signal into cell C is asserted, there is a check to determine if cell C's CHAIN signal is asserted. If so, and that border has previously been opened, step 85 is followed by step 83, and the token is advanced (setting the appropriate one of the latch or memory device of the configuration logic 22 of the target cell). If, however, the target cell is in the chain, but the boundary between them is not open, no attempt is made to enter cell C, but the algorithm will still return to step 83 where the token is advanced within the configuration logic 22 to identify the next boundary corner in order, NE. The cell on the boundary clockwise adjacent the NE corner of the cell, cell A, is the new target cell.

Assuming step 85 finds that the cell C is not part of the chain being formed, the algorithm proceeds to step 86 to open the target cell, cell C, by asserting the OPEN signal into the cell. Again, as described above, the OPEN signal causes the configuration logic 22 to operate the multiplexer 12 associated with the boundary between cells D and C to select the IN bus from cell D (FIG. 1). The algorithm now proceeds to test cell D at step 87. If the test fails, finding cell C to be defective in some way, the OPEN signal to cell C (generated by cell D) is deasserted in step 90, and a return to step 83 is made.

If, however, cell C passes, step 87 is left in favor of a return to step 83, where the token is advanced in to cell C by setting the latch boundary just crossed of the configuration logic 22 to assert the SW signal, and the CHAIN signal. Steps 84 and 85 are performed as described above.

In this discussion, we will assume that the cells that are clockwise adjacent the SW and NW boundaries are unable to pass the test performed in step 87. Thus, after the token is first moved into cell C (step 83), steps 84, 85, 86, 87, and 90 will be performed once. The algorithm returns to step 83 to move the token to assert the NW signal, and steps 84–90 again performed, again to find the target inoperable. Once again the token is moved—to assert the NE signal, making cell B the target. Assuming the cell B to be good, step 87 will proceed back to step 83, and cell B will be included in the chain that is so far formed by cells D, C, and B.

The algorithm continues, until, as FIG. 2 illustrates, a return is made to a peripheral cell or the seminal cell (cell D in FIG. 4A, or cell 10J in FIG. 2), at which time the step 84 moves to the exit step, DONE.

Figure 5A:
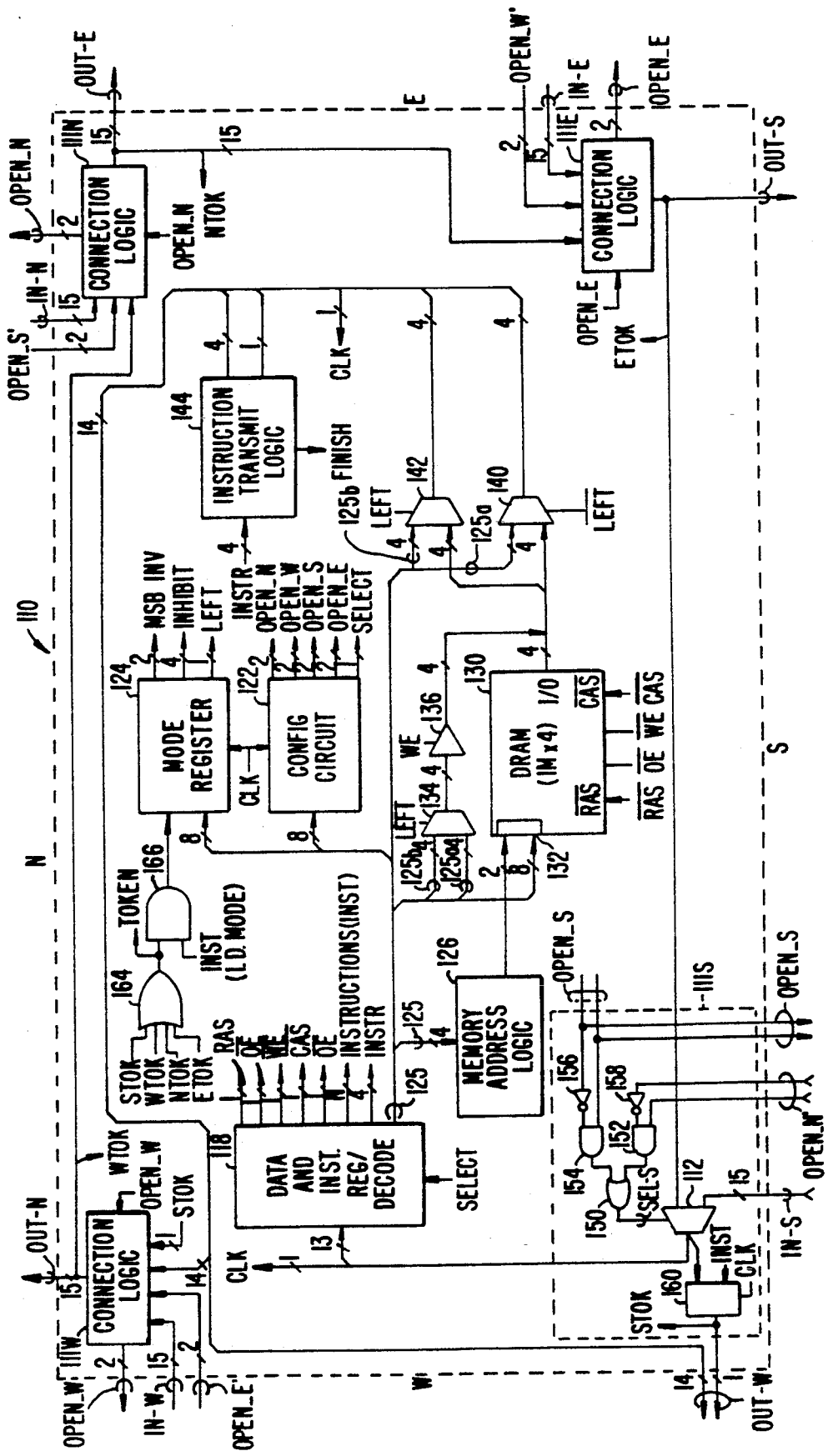
FIG. 5A illustrates a memory-containing cell constructed in accordance with the teachings of the present invention.

Turning now to FIG. 5A, there is illustrated use of the cell architecture 10 (FIG. 1) to form a memory circuit that can then be combined and intercoupled with other substantially identically constructed cells, to form a large scale memory system of the present invention. As FIG. 5A illustrates, a cell, designated generally with the reference numeral 110, is constructed in much the same way as that of FIG. 1, i.e., the cell 110 is provided four edge boundaries north, . . . , west (N, . . . , W, respectively), separating it from its four neighboring cells adjacent each boundary. Each boundary N, . . . , W has associated therewith connection logic 111N, 111E, 111S, and 111W that operate to provide communication with and between the cell 110 and a selected one of its neighbors.

The circuitry of the connection logic 111N, . . . , 111W are substantially identical so that a description of one will apply equally to all. Accordingly, as illustrated by the detail of connection logic 111S, each of the connection logic includes a multiplexer 112 that operates to select between two 15-bit buses that each carry data and control signals. In the case of connection logic 111S, the two 15-bit busses are the input bus from the neighbor cell adjacent the S boundary of cell 110, IN-S, and the 15-bit output from connection logic 111E. Note that the 15-bit output of connection logic 111E forms an output bus (OUT-S) to couple signalling from the cell 110 to its neighbor adjacent the boundary S in the same manner signalling is coupled by the IN-S bus from the neighbor to the cell 110. Operation of the respective connection logic 111N, . . . , 111W will be described more fully below. Suffice it to say here that the connection logic 111N, . . . , 111W establishes the necessary communication paths among the memory-containing cells configured substantially identical as that illustrated in FIG. 5A, in order to form the memory system of the present invention. The 15-bit input buses (IN-N, . . . , IN-W) coupled to one input of the connection logic 111N, . . . , 111W, and the 15-bit output busses (OUT-N, . . . , OUT-W) from the output of each connection logic, communicate data and control signals, including a periodic clock signal, into and out of the cell 110. These busses form the communication paths among the multiplicity of memory-containing cells formed on a wafer to construct a wafer scale integrated memory-system according to the present invention. The signaling carried by these busses, as will be described below, carry the instructions and data to configure and operate each individual cell, or groups of cells, to store and retrieve data.

Crossing each boundary N, . . . , W of, and into, the cell 110 are two-bit busses OPEN_S', . . . , OPEN E', respectively; likewise, there are 2-bit busses (OPEN_N, . . . , OPEN_W) that emanate from the cell 110 and cross each boundary N, . . . , W, respectively. (Only the 2-bit bus, OPEN_S, associated with the S boundary is shown; it will be understood, however, that similar 2-bit busses OPEN_N, OPEN_E, and OPEN_W couple dual-railed signals across boundaries N, E, and W, respectively.) These are the OPEN signals that, when asserted, operate to open a boundary in essentially the manner described above.

All control signals, such as the OPEN signals, that cross a boundary from one cell to another are preferably dual-railed in the sense that each is communicated in its true and complement form. Using dual-railed signals helps to ensure that a 1-bit signal is not erroneously generated by one cell and acted upon by another cell. Thus, for example, the neighbor cell adjacent the S boundary of cell 110 communicates an open north boundary (OPEN_N'), in both its TRUE and logic complement form to the connection logic 111S of cell 110. The connection logic 111S will respond only if both forms of the OPEN_N' signal are correct. The neighbor cells adjacent the boundaries W, N, and E similarly communicate dual-railed control signals, such as the dual-railed OPEN signals on the 2-bit busses OPEN_E', OPEN_S', and OPEN_W', respectively, to the connection logic 111W, 111N, and 111E of cell 110.

And, of course, cell 110 itself produces dual-railed OPEN signals OPEN_N, . . . , OPEN_W, that are respectively communicated therefrom to the neighboring cells adjacent the boundaries N, . . . , W—as well as to the connection logic associated with such boundary, as illustrated for the S boundary.

Digressing for a moment, the information that is carried by 15-bit input and output buses IN-N, . . . , IN-W and OUT-N, . . . , OUT-W to and from the memory-containing cell 110 is configured as follows: A 4-bit field contains instruction information, including that for configuring the cell, establishing connections among cells, and for reading and writing data; an 8-bit field contains data (to be written to or read from memory), or address/configuration information, depending upon the instruction; a 1-bit field is reserved for a periodic clock (CLK) signal; a 1-bit field is reserved for parity that is computed over the 12 bits formed by the data and instruction fields; and a 1-bit field is reserved for a token bit that is generated by each respective cell, as will be seen.

Returning to FIG. 5A, the memory-containing cell 110 includes a data and instruction register/decoder 118 that receives, and latches, the 4-bit instruction and 8-bit data fields selected and communicated by the multiplexer 112 contained in the connection logic 111S. Although not specifically shown, the register/decoder 118 contains the decoding logic that operates to decode the 4-bit instruction field, producing therefrom various (N in number) instruction decode signals (INST) that condition other of the circuits carried by the memory cell 110 for performing various operations. Certain of such decodes are specifically illustrated (e.g. $\overline{RAS}$, $\overline{CAS}$, $\overline{WE}$, $\overline{OE}$) as issuing from the register/decoder 118 for later discussion. The instructions that produce the $\overline{RAS}$ and $\overline{CAS}$ decodes are decoded immediately upon receipt because the memory unit (DRAM 130) will usually require some preconditioning before it can be accessed. The remaining decodes await the clock signal. Other of the decodes are shown where they are applied, and are identified herein as "INST (identification of instruction), e.g., INST (LD_MODE) for the load mode register instruction. The various instructions, their bit configurations, and their operation are explained hereinafter with respect to the discussion of Table 1 (below).

The register/decoder 118 receives an internally generated signal, SELECT, for purposes that will be discussed below.

Not specifically shown is parity checking logic contained in the register/decoder 118 that checks the parity bit.

The CLK signal (brought onto the cell 110) operates to latch the 12 bits of information in the register/decoder 118. CLK is also applied to various of the circuitry of the memory-containing cell to perform similar latching and clocking functions for synchronous operation.

As will be seen with respect to the timing diagram (FIG. 8) used to describe a read operation, most of the instructions are latched at one edge (e.g., the rising edge) of the CLK signal, but are not acted upon until the next immediately successive rising edge.

The data and instruction register also decodes certain row address strobe (RAS) and column address strobe (CAS) instructions. These two instructions are treated differently, insofar as the timing of the appearance of their decodes (as $\overline{RAS}$ and $\overline{CAS}$) are concerned. These instructions are decoded immediately to produce the corresponding INST decode $\overline{RAS}$ and $\overline{CAS}$ signals that load row and column address data into the address circuits 132 of a DRAM 130. The reason for this is that most dynamic random address memories, such as DRAM 130, require, or at least suggest, that the RAS and CAS (or $\overline{RAS}$ and $\overline{CAS}$ signals, as the case may be) be applied a certain amount of minimum time before any memory access operation (read or write) is made.

An eight bit field of the register/decoder 118 supplies the eight data/address field bits to an 8-bit internal bus 125 which, in turn, communicates the 8-bits of data/address information to configuration logic 122, the mode register 124, and to the address circuits 132 of the DRAM 130. In addition, 4-bit portions of the internal bus 125 are applied to each of two 4-bit inputs of a multiplexer 134, the 4-bit output of which is coupled to the 4-bit input/output (I/O) bus of the DRAM 130 via a tri-state device 136. The multiplexer 134 and tri-state device 136 form the data path for data to be written to the DRAM 130. Which 4-bit portion is written depends upon the state of the LEFT signal from the mode register 124, which is set during initial (or a subsequent) configuration of the memory cell 110, as will be described hereinafter.

The DRAM 130 is organized as a 1,048,576 words by 4 bits integrated memory structure, such as that manufactured and distributed by Toshiba MOS Memory Products, and sold under the Part No. TC514410J/Z-80 or TC514410J/Z-10. When cell 110 is included in a wafer scale integration forming a memory system according to the present invention, each such cell is logically configured as four 256 K by 4-bit word memory banks. As will be seen, one memory-containing cell 110 corresponds to four bits of the 8-bit data field; that is, when a read (or write operation) is performed, the first cell 110 that is read supplies the most significant four bits (MSBs), while the next cell in line will supply the four least significant bits (LSBs). In the case of write operations, the four MSBs of the 8-bit data field of the write instruction are written to the first encountered cell 110, and the four LSBs are written to the next in line cell 110 (i.e., the next cell in line set to respond to write, or read, instructions—signified by assertion of the SELECT signal). Which cell is first in line or next in line will be discussed hereinafter.

Structuring the memory-containing cell 110 as four quadrants or banks allows the cell to continue to be used even though one or more of the banks may be inoperable. Thus, the memory-containing cell 110 can still be usable as long as at least one bank of memory, and the circuitry needed to access that bank, is operable.

The 4-bits of data read from the I/O port of DRAM 130 is communicated to one (of two) 4-bit input of each of two multiplexers 140, 142. The other 4-bit input of each of the multiplexers 140, 142 receives one or the other of the two 4-bit portions of the 8-bit bus 125. The outputs of the multiplexers 140, 142 form the 8-bit data/address field that ultimately becomes the 15-bit output bus OUT-W that is communicated to the cell adjacent boundary W.

In addition to the eight bits provided by the multiplexers 140, 142, the CLK signal, parity, and the -4-bit instruction field join the eight bits from the multiplexers to make up 14 of the 15 bits that are communicated across the boundary (e.g., boundary W) of the memory-containing cell 110. Parity and the four bits of instruction come from a instruction transmit logic 144 that includes a conventional parity generator for generating a parity bit over the 12 bits of data/instruction applied to what ultimately becomes the 15-bit instruction and data communicated to the next cell in line. Although not specifically shown in FIG. 5A for reasons of ease of illustration, it will be appreciated that the instruction transmit logic receives the 8 bits of data from multiplexers 142, 144 for generating parity. The instruction transmit logic also receives the 4-bits of instruction (INSTR) from the register/decoder 118, to pass on unmodified, or, as will be seen, modified in certain instances to indicate that certain requested actions have been performed by the cell 110.

Finally, the instruction transmit logic 144 also contains combinatorial logic operable to produce a FINISH signal when it is determined that requested (by an instruction) action has been taken. The FINISH signal operates to reset the flip-flop 202 (FIG. 6) to de-assert the SELECT signal. Note that the MYGRP signal (produced by the latch 196—FIG. 6) is left undisturbed.

Thus, the designation of the cell is not changed so that if the group so designated is desired to be accessed again later, only the load address (LD_ADR) instruction will need be sent to select the group. The logical equations for the FINISH signal are (the "*" symbol, as used below, is intended to refer to the logical AND operation; the "+" symbol is intended to refer to the logical OR operation):

---
FINISH = RIGHT*SELECT*(READ_B + READ_R + WRITE_B + WRITE_R) + LEFT*SELECT*(READ_B+WRITE_B)
---

The logical equations for the write enable (WE) and output enable (OE) signals (which are developed by the data and instruction register and decode unit 118) are:

$$WE = SELECT*(LEFT*WRITE\_B + \overline{LEFT}*WRITE\_R)$$

$$OE = SELECT*(LEFT*READ\_B + \overline{LEFT}*READ\_R),$$

As can be seen from the WE and OE equations, memory access of the DRAM 130 can only occur if the cell 110 is "selected," i.e., by assertion of the SELECT signal.

Parity is calculated, and checked at various locations, across the 12-bits of instruction and data/address fields in conventional fashion. The parity circuitry for performing these parity operations is not specifically shown, but will be recognized by those skilled in this art as being included in the circuitry shown in FIG. 5A. It is left out for purposes of clarity.

Returning to the connection logic 111S, as FIG. 5A further illustrates, the connection logic selection between the two 15-bit buses for connection to the output of the multiplexer 112 is effected by a combinatorial logic configuration comprising a 2-input OR gate 150 connected to receive the outputs of a pair of 2-input AND gates 152, 154, and INVERTERS 156, 158. The configuration circuit 122 produces the dual-railed OPEN signals OPEN_N, OPEN_W, OPEN_W, and OPEN_E that will, when asserted, open the corresponding boundary. Thus, for example, if OPEN_S is asserted the multiplexer 112 selects the 15-bit bus IN-S from the neighbor cell at the S boundary. At the same time, the OPEN_S signaling is communicated across the S boundary to the connection logic (not shown) of the neighbor cell, causing (there) selection of the OUT-S bus from the connection logic 111E. The S boundary is thereby opened.

Conversely, the S boundary may be opened by the neighbor cell by assertion of the OPEN_N' signalling. Obviously, the signalling OPEN_S and OPEN_N' are mutually exclusive.

Connection logic 111S further includes token-passing logic 160 that receives the one bit token carried by the 15-bit bus from the output of the multiplexer 12. The output of the token-passing logic 160 forms the token bit associated with each of the boundaries N, ..., S (i.e., the signals designated as NTOK,..., STOK, respectively). Thus, for example, the output of the token-passing logic 160, when HIGH asserts the "south-token" (STOK) signal, indicating that the token is presently at the connection logic 111S associated with the S border of the memory-containing cell 110.

It will be remembered from the discussion above that, in a wafer scale integration, only one cell at any one time holds the token, and that the token indicates the head of a chain being formed. Here, in this embodiment of the invention, the possession of the token conditions the cell for testing and subsequent selection. The memory-containing cell 110 shown in FIG. 5A holding the token will have one of the token signals from the token-passing logic 160 of the connection logic 111W, ..., 111S (i.e., WTOK, ..., STOK, respectively) asserted. A 4-input OR gate 164 receives the four token signals WTOK, ..., STOK, to produce a TOKEN signal, indicating, when asserted, that the token is resident in cell 110. The output of OR gate 164 is applied to an input of an AND gate 166 that also receives a load mode register instruction decode, INST (LD_MODE). The output of the AND gate 166 provides the enable signal that conditions the mode register 124 for receipt of the information carried by the bus 125. When so enabled, the mode register will latch the bus 125 information when clocked by the CLK signal. When the token is resident in the cell 110 (as indicated by assertion of the TOKEN signal from the OR gate 164), the mode register 124 will be loaded with information that specifies the particular mode of operation of the memory of that cell.

Figure 5B:
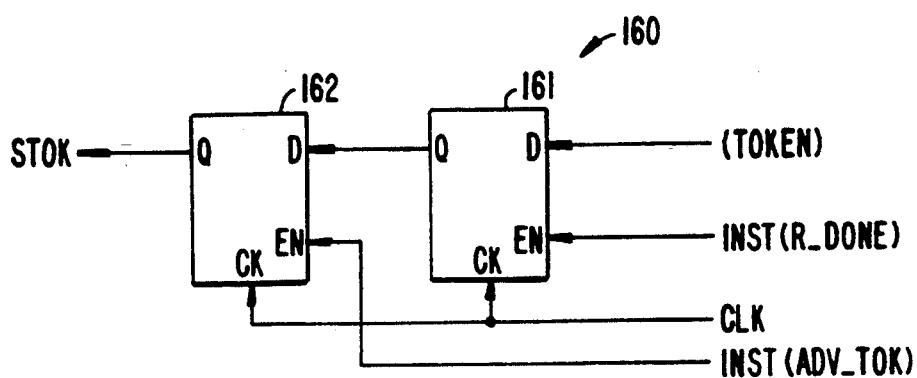
FIG. 5B illustrates in greater detail the token-passing logic shown in FIG. 5A.

The token-passing logic 160, illustrated in greater detail in FIG. 5B, comprises a pair of D type flip-flops 161 and 162 in a master/slave configuration. The data (D) input of the master flip-flop 161 receives the token bit that is passed on the 14-bit bus from the associated multiplexer 112, here multiplexer 112S of connection logic 111S. The enable (EN) input of the master flip-flop 161 receives the instruction decode for read done (INST (R_DONE)), and the clock input receives the clock (CLK) signal.

The slave flip-flop 162 receives, at its data (D) input the data output (Q) of the master flip-flop 161, the enable (EN) input receives the advance token decode (INST (ADV_TOK)), and the clock (CLK) input receives the clock signal.

The token-passing logic 160 operates to receive the token when and if placed on the 14-bit bus received by the associated multiplexer 112. The token is clocked into the master flip-flop 161 with by the read done instruction decode (e.g., INST(R_DONE)). An advance token instruction decode, INST(ADV_TOK), will transfer the token to the slave flip-flop 162.

In order to pass a token from one cell to another it is preferable that a sequence of instructions be used, first to load the master flip-flop 161, then to transfer the Token to the slave flip-flop 162. The reason for this sequence is to avoid race problems, and to ensure that the Token is not lost in transit. The sequence proceeds generally as follows: First, a read done (R_DONE)—see Table 1, below instruction is used to condition the cell receiving the Token by enabling the master flip-flop 161 of the token-passing logic 160 of that cell. Receipt of the R_DONE instruction will cause the register/decoder 118 of each cell receiving the instruction to assert a INST(R_DONE) decode. This asserted instruction decode will enable the master flip-flops 161 of the cell so that the accompanying clock will cause that master flip-flop 161 having at its data (D) input the Token, to be set. All other master flip-flops of the cell (and any other cell) will remain unchanged—with one exception. That master flip-flop 161 of the cell presently holding the Token (that is being passed on) will be reset to a non-Token (e.g., ZERO) state.

Note that now there are two cells having indications of the Token. The cell from which the Token is being passed has the slave flip-flop 162 set to indicate presence of the Token. The cell in the process of receiving the Token has its master flip-flop 161 set, providing an output to the associated slave flip-flop 162, conditioning transfer of the Token to that slave flip-flop 162, completing the transfer.

Thus, the R_DONE instruction is followed by an advance token (ADV_TOK) instruction. The register/decoder 118 of each cell receiving the instruction will assert an INST (ADV_TOK) decode, enabling the associated slave flip-flops 162 to accept and latch the data output (Q) of the corresponding master flip-flop 161. The cell receiving the Token will have one of its slave flip-flops 162 set to indicate presence of the Token. The cell from which the Token is received will have the slave flip-flop 162 reset to a non-Token state, since that is the output received from the associated master flip-flop 161. The Token has thereby been passed from one cell to another (or rotated, clockwise, to an adjacent boundary of the same cell). If desired, an R_DONE instruction can be circulated to reset the master flip_flop 161 of the token-passing logic holding the Token.

Figure 6:
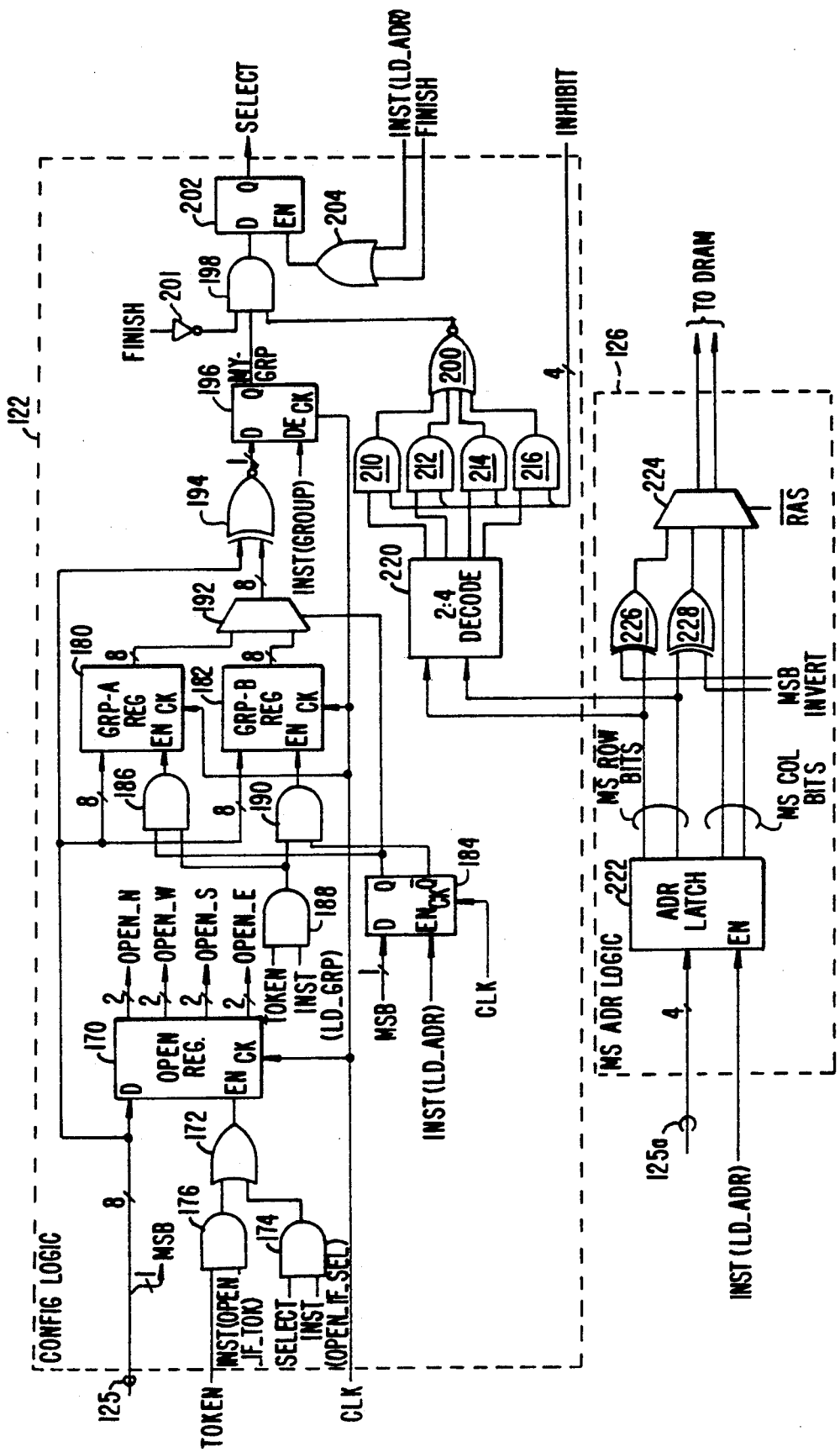
FIG. 6 illustrates in greater detail the configuration logic and memory address logic shown in FIG. 5A.

Operation of the circuitry carried by the memory-containing cell 110 will be explained below in further detail in connection with discussion of the operation codes (i.e., instructions) carried by the 15-bit buses. Before that discussion, however, it will be advantageous to discuss the details of the configuration logic 122 and memory address logic 126, which is shown in greater detail in FIG. 6. As FIG. 6 shows, the configuration logic 122 includes an open register 170 that receives the 8 bits of data/address communicated by the internal bus 125. The open register 170 holds information for opening a boundary of the cell 110, and is the source of the OPEN_N, . . . OPEN_E signals-; (in dual-railed form, as described above) that opens a boundary to a neighbor cell. The open register 170 and is enabled by combinatorial logic, including an OR gate 172 and a pair of AND gates 174 and 176, that operates to further decode certain instructions when data carried by the internal bus 125 is information for opening a boundary. The AND gate 174 produces an enable signal when the SELECT signal (produced by the configuration logic 122, as will be described) is asserted with presence of an "open if select is present" (OPEN_IF_SEL) INST decode. The open register 170 may also be enabled by concurrent assertion of the TOKEN signal (from OR gate 164, FIG. 5A) and an "open if token is present" (OPEN_IF_TOK) INST decode. The data is latched on CLK when the open register 170 is enabled.

The 8-bit internal bus 125 is also communicated to an 8-bit group-A (GRP-A) register 180 and a group-B (GRP-B) register 182. These two registers hold information that identify the cell's group membership, permitting group action to be described. Group membership is established when the Token is held by the cell. The GRP-A/GRP-B registers 180, 182 are enabled, via the AND gates 186, 188, by coincidence of an indication of the presence of the token in the cell (in the form of the TOKEN signal from the OR gate 166—FIG. 5A), and "load group identification" (LD_GRP) INST decode. The state of a 1-bit latch 184 determines which of the GRP-A/B registers 180, 182 will be loaded when TOKEN signal is present and LD_GRP signal is asserted. The 1-bit latch 184 is set (asserting the Q output) when the MSB of the register/decoder 118 (FIG. 5A), as communicated by the 8-bit latch 125, is TRUE, and when the "load address" (LD_ADR) INST decode is asserted. When the 1-bit latch 184 is cleared (i.e., the A output is not asserted), the GRP-B register 182 will be loaded (if TOKEN and LD-GRP INST decode are TRUE).

The cell 110 can have, at any moment in time, only one of the two membership identities designated by the content of the GRP-A/B registers 180, 182. The selection of the cell 110 is made by loading the desired identification into the register/decoder 118 (FIG. 5A) to place that identification on the internal bus 125. The cell's group assignment is then determined by multiplexer 192 and an 8-bit EXCLUSIVE-NOR circuit 194, which compares the requested group with this cell's group identity. The result of that determination is loaded into the latch 196 by a "group" INST (GROUP) decode, which in turn asserts a MYGRP signal.

The output of the latch 196 is applied to an AND gate 198, which receives also the output of a 4-input NOR gate 200 and the FINISH signal (from instruction transmit logic 144—FIG. 5A) via an INVERTOR 201. The output of the AND gate 198 is latched by a register 202 when either the FINISH or the load address instruction decode, INST (LD_ADR), is TRUE, as determined by the OR gate 204. Thereby, the MYGRP signal is transferred to the now set flip-flop 202, where it becomes the asserted SELECT signal, signifying selection of this particular cell for subsequent memory access operations.

The flip-flop 202 is reset by the assertion of the FINISH signal, as described above, de-selecting the cell 110.

The SELECT signal is, as FIG. 5A illustrates, communicated to the register/decoder 118. There, it operates to gate decoding of the RAS and CAS instructions to produce the $\overline{RAS}$ and $\overline{CAS}$ signals for proper operation of the DRAM 130. Thus, it can be seen that only those memory-containing cells 110 that are in a selected state (i.e., the SELECT signal asserted) will be capable of responding to memory access instructions.

Selection of which bank of memory is used during any particular memory operation is determined by the address information that has been set in the memory cell (i.e., the content of the address latch 222, FIG. 6, holding the MSBs for the row and column addresses, and the content of the address circuits 132, FIG. 5A, of the DRAM 130). However, during testing, it may be found that although the DRAM 130 may have inoperable portions, but other portions of the DRAM operate satisfactorily. In this case, the inoperable portions can be identified, and blocked from further (inadvertent) access by INHIBIT signalling communicated on four signal lines from the mode register 124 (FIG. 5A). Each of the four INHIBIT signals is communicated to a corresponding one of four AND gates 210 212, 214, and 216 to, when asserted, inhibit the cell (i.e., one or more banks of the DRAM 130) from being selected. A 2-to-4 decode circuit, having mutually exclusive outputs, provides signaling indicative of which of the four banks of the DRAM 130 (if any) is to be accessed during a memory (read or write) operation.

The 2-to-4 decode 220 receives, as inputs, two bits from an address latch 222 contained in the memory address logic 126. These two bits also form the two most significant bits of a row address that is supplied to the internal addressing circuits 132 of the DRAM 130 (where they are combined with eight bits communicated by the bus 125 to form a 10-bit row address).

The address latch 222 receives four of the eight bits communicated by bus 125, two of which are the most significant row bits as explained above. The other two bits form the most significant bits of the column address, which are communicated to the address circuit 132 of the DRAM 130 via multiplexer 224. The two most-significant row address bits are communicated to the multiplexer 224 via EXCLUSIVE-OR gates 226 and 228 which operate, in response to MSB INVERT signals from the mode register 124 (FIG. 5A), to selectively invert one, the other, or both of the most significant row address bits that are ultimately communicated to the address circuitry 132 of the DRAM 130.

Selection between the most significant row or column bits is effected by the ($\overline{RAS}$) signal from the register/decoder 118 (FIG. 5A).

Before going to a description and explanation of the memory circuit of the memory cell 110, it may be advantageous to pause here and consider one of the more significant aspects of the invention. As indicated above, each quadrant or bank of the DRAM 130 of the memory cell 110 is capable of being identified for memory operations by a Group identification and a memory address. Consider the situation that can arise when, after testing, certain of the tested memory cells 110 are found to have portions of their memory to be operable, other portions not operable. The use of the INHIBIT and MSB INVERT bits can reconfigure any memory cell 110 to make it look as if it formed a portion (bank) of another memory cell, filling in that portion of the another memory that was found inoperable by testing.

Remember that each of the AND gates 210–216 are associated with each (of the four available) bank of the DRAM 130. Remember also that selection of the bank desired is made by the two most significant bits of the row address that are held in the address register 222. Assume, for the moment that a first memory cell 110 has been found to have those banks associated, for example, with the AND gates 212, 214, and 216 to be operable, and that the memory bank associated with the AND gate 210 of the memory cell tested inoperable. Assume further that a second memory cell 110 has at least one bank of DRAM 130 that tested good. This operable bank of DRAM 130 of the second memory cell can be used in place of the inoperable bank of the first memory cell, as follows: First, during configuration, both the first and second memory cells are preset (i.e., their respective group registers 180/182 set) to identify them as being members of the same group. Then, to ensure that the inoperable bank (or inoperable banks, if that be the case) of the first memory cell is not accessible, the INHIBIT bit for that bank is set (by loading the mode register 124) to disable the cell for that particular bank. With the INHIBIT bit so set, and the two most significant bits of the row address (held in the address register 222, FIG. 6) identify that bank of the DRAM 130 associated with the AND gate 210, the assertion of the SELECT signal is inhibited because the corresponding one of the AND gates 210, . . . , 216 is disabled, causing the NOR gate 200 to output a LOW, disabling the AND gate 198 and preventing the flip-flop 202 from being set to assert the SELECT signal. Thereby, selection of the first cell for memory operations that attempt to access the inoperable bank (associated with the AND gate 210) will be inhibited because the AND gates 198 and 210 are disabled; the remaining AND gates 212–216 will be enabled by the states of the corresponding INHIBIT bits applied thereto, permitting access to the three banks of the DRAM 130 associated therewith. If the second memory cell contains more than the one operable bank to be substituted for the inoperable bank of the first cell, they preferably are made inaccessible in the same way:—setting their respective INHIBIT bits. The reason for this will become clear to those skilled in this art after the discussion, below, concerning how read and write operations are preferably performed.

A read (or write) instruction that is communicated to the first cell, in which a memory location in the inoperable bank is addressed (by a prior LD_ADR instruction, see below), will cause the first cell to pass that instruction on to a succeeding cell.

The operable bank of the second memory cell may be configured to respond to a read (or write) instruction as if it were the first cell (which cannot respond because the addressed bank is inoperable). This is done by using the 2-bit MSB INVERT signal. During configuration, after it has been found that the first cell has an inoperable bank, and that the second cell has an operable bank that can be substituted, the mode register 124 (FIG. 5A) will need to be loaded with information that, when applied to the EXCLUSIVE-OR gates 226, 228 (FIG. 6), will cause proper inversion of the two most significant row bits from the address latch 222. For example, if the third bank of the second cell is to be substituted for the first bank of the first cell, the address applied to the DRAM 130 of the second cell must address a memory location of the third bank, even though the address (i.e., the two MSBs of the row address) identifies or points to the first bank. Thus, the purpose of the MSB INVERT bits is to remap the two most significant bits of the row address so that the third bank of the second cell is addressed—notwithstanding the fact that an address for a memory location in the first bank is being requested.

In the manner described above, the second memory cell "fills in" the hole of the first memory cell.

Taking this concept a step further, assume that given five memory cells, four each have one bank of memory that tested bad, the fifth has all four banks of memory that tested operable. It will be evident to those skilled in this art that using the technique described above, the five memory cells can be configured to appear and function as four memory cells each with all four banks operable; the fifth memory cell is usable to fill in the holes of the other four.

Having now briefly described the overall circuitry used to form the memory containing cell 110, as illustrated in FIGS. 5 and 6, operation of that circuitry may best be understood in conjunction with a discussion of the 4-bit instructions that effect operation. As explained previously, the 4-bit instructions are communicated, from cell to cell, via a 15-bit bus. Since there are four bits, there are most can only be 16 separate instructions. The instructions utilize the 8-bit data/address field to set up and configure the cells 110, to initiate read and write operations that can be communicated back to controller, and to initiate other operations as will be described. The bit configurations instructions, or "OP CODES", are set forth briefly in the following table, together with the acronym of the instruction, and its operation or function:

TABLE I

| 21001 OPCODE: | COMMAND: | OPERATION: |
|---|---|---|
| 0000 | R_DONE | Read Done: Signifies that a read operation is complete. The 8-bit data field accompanying the instruction will hold data read. Also used as an instruction in Token-passing routines. |
| 0001 | READ_R | Read Remainder: Effects a read of a 4-bit nibble. The 4-bit nibble obtained is inserted in low-order 4-bit nibble of the 8-bit data field. The Opcode is then changed to a read done (R_DONE) instruction. |
| 0010 | GROUP | Group: Initiates a compare of the content of a selected Group register (180/182) with content of the data register (118). If equal, the MYGRP is signal asserted to identify each cell which is associated with this particular group of (one or more) cells. |
| 0011 | READ_B | Read Both: Causes the first cell encounted (by this instruction with SELECT asserted to insert 4-bits of data in the left (high-order) nibble data field. The Opcode is then changed to a READ_R instruction, and the instruction, so modified, is passed on to the next cell in line, and the SELECT signal de-asserted. |
| 0100 | W_DONE | Write Done: Identifies the completion of a write (one byte) of data operation. |
| 0101 | WRITE_R | Write Remainder: The 4-bit nibble of data remaining after a write both (WRITE_B) instruction (executed by the preceding cell of the selected group) is written to the memory cell executing the instruction. The SELECT is de-asserted, and the instruction is changed to a Write Done (W_DONE). |
| 0110 | UNCAS | De-assert Column Address Strobe: Causes the column address strobe ($\overline{CAS}$) signal to be de-asserted (if asserted). |
| 0111 | WRITE_B | Write Both: The 4 most significant bits of data are written to the memory cell executing the instruction. The instruction is converted to a WRITE_R instruction to write the remaining portion (4 bits) of data to the next cell of group in order. The SELECT signal is de-asserted. |
| 1000 | LD_ADR | Load Address: 4 bits of address information (high-order 2 bits column, 2 bits row) accompanying this instruction are set into 4-bit address register; the A/B group select flip-flop is set by copying a bit from the data field (e.g., MSB) into the flip-flop. |
| 1001 | RAS | Row Address Strobe: Asserts RAS (de-asserting $\overline{RAS}$), and loads the 8-bit content of the accompanying data field (via the data register), plus two bits from the 4-bit address register 126, into the row address portion of the address register 132 of the DRAM. |
| 1010 | CAS | Column Address Strobe: Loads 8-bit content of accompanying data field (via data register), plus two bits from the 4-bit address register 126, into the column address portion the the address register 132 of the DRAM. |
| 1011 | LD_MODE | Load Mode: Loads the mode register 124 (FIG. 5A) of the cell containing the token with the 8 bits of data in the data field. |
| 1100 | LD_GROUP | Load Group: Loads the group A or group B register 180, 182 (depending upon setting of A/B flop) with group identification of cell then containing the token. |
| 1101 | OPEN_IF_TOKEN | Open If Token: Loads the open register 170 of the cell then containing the token with information, contained in the data field accompanying the instruction, that identifies which cell boundary is to be opened. |
| 1110 | OPEN_IF_SEL | Open if Selected: Loads the Open register 170 if the cell's SELECT signal is asserted. |
| 1111 | ADV_TOKEN | Advance Token: Advances token along current path. May advance the token around the corners of one cell, or from one cell to another. |
|  | NOP | No Operation: An alias for the R_DONE, W_DONE or OPEN_IF_TOK (when no token is loaded in the chain) instructions. |
|  | UNRAS | De-assert Column Address Strobe: Alias for GROUP instruction when the address accompanying the instruction is a "don't care." Used to de-assert the RAS signal. |

Control and a Controller Unit

Figure 7:
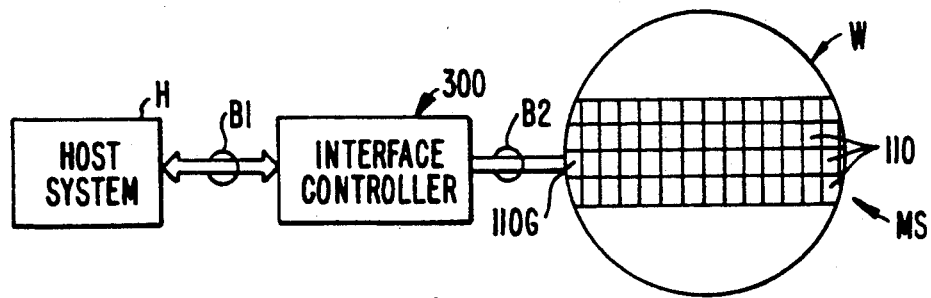
FIG. 7 is a diagrammatic illustration of connection of a host system to a memory system constructed in accordance with the teachings of the present invention by an interface controller.

A description of the operation of a wafer scale integrated memory system using the cell architecture of FIGS. 5A and 6 is provided below. For the moment, it will be advantageous to consider an interface controller that will connect to and operate to translate requests from a host system, such as a computing system, and the memory system. Diagrammatically illustrated in FIG. 7 is such an interface controller, designated generally with the reference numeral 300. Also illustrated in FIG. 7 is a wafer scale integrated memory system MS comprising a plurality of memory cells 110, formed on a wafer W, and constructed as discussed with respect to FIGS. 5 and 6, and a host system (H). As FIG. 7 shows, the interface controller 300 connects between the host system H and the memory system MS via connecting busses B1 and B2. The connection to the wafer W is via a memory cell 110G, which forms the entry and exit point for the memory cells 110 to be accessed on the wafer W.

So connected, the interface controller 300 will function as a memory controller, translating memory access requests of the host system H to the signalling necessary for accessing the memory carried by the individual cells of the memory system MS to store or retrieve data.

Figure 8:
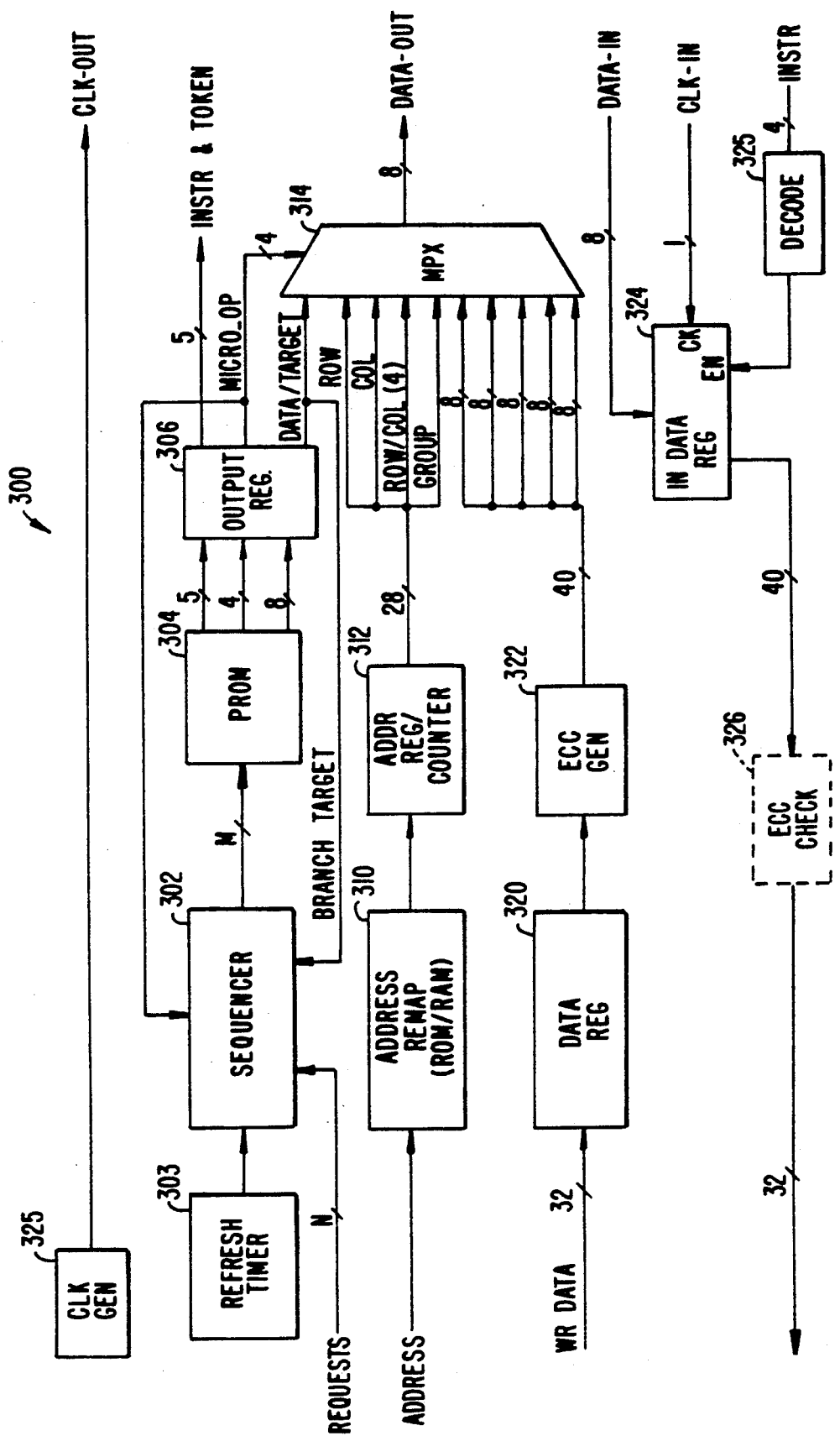
FIG. 8 is a block diagram of the interface controller shown in FIG. 7 and used in communicating data between the host computer and the wafer scale integrated memory system.

Referring now to FIG. 8 the interface controller 300 is shown as including a sequencer 302, in the form of a small, specialized state machine. The sequencer 302 operates to interpret N-bit REQUEST signals from the host system H, converting them, in association with the accompanying circuitry that makes up the interface controller, to sequences of instructions that will be acted upon by various of the cells 110 that make up the memory system MS to comply with the REQUEST signal. The output of the sequencer 302 connects, by M signal lines, to a programmable read-only-memory (PROM) 304. Each REQUEST of the host system will produce a sequence of signals that, when applied to the PROM 304, produces a 13-bit result that is latched in the output register 306: Five bits form the 4-bit instruction (INSTR) together with the Token bit that will be communicated to the cells of the memory system MS; another four bits of DATA/TARGET information form an operation code (MICRO·OP) used for selection control of the multiplexer 314; and eight bits that are, when the situation calls, inserted in the 8-bit data field that will accompany the 4-bit INSTR field that will be communicated to the cells of the memory system MS.

The sequencer 302 is also connected to receive periodic signals from a refresh timer 303. The refresh timer 303, in effect, generates interrupts that indicate a need for a routine for refreshing the DRAMs carried by the memory system MS (FIG. 7) with which the interface controller 300 is working. In response to the interrupt signal generated by the refresh timer 303, the sequencer will address a memory location of the PROM 304 that contains a target address for the refresh routine. That target address is coupled back to the sequencer 302, via the output register 306, as the branch address to the refresh routine.

Address signals (ADDRESS) from the host system H are applied to an address remap unit 310, which may be either in the form of a RAM or a ROM (although the raw addresses from the host could be used directly if the addressing scheme of the host so permits, or the remapping is performed by the host itself). The address remap unit functions to translate the address signals received from the host to those needed to access particular memory locations of particular cells for writing or reading data. The output of the address remap unit 310 is coupled to an address register/counter 312, the output of which is, in turn, coupled to the multiplexer 314.

As FIG. 8 illustrates, the address register/counter 312 supplies a 28-bit output to the multiplexer 314, providing the row, column, and group information, as well the 4-bits of row/column (MSB) information to be loaded in address latch 122 (FIG. 6), required by the various of the memory instructions. Placement of which piece of information in which instruction is the function of the multiplexer 314, under control of the MICRO-OP signals from the PROM 304 (via the output register 306).

If the host system H requests data to be written to the memory system MS, the ADDRESS will be accompanied by the 32-bit words of data. The data is received from the host system H by a DATA register 320, and from there are communicated, in parallel, to an error correcting (ECC) generator 322. The ECC generator 322 functions to generate eight bits of ECC code, calculated over the 32 bits of data, that is capable of correcting 1-bit errors, and detecting 2-bit errors. The output of the ECC generator 322 is a 40-bit word (32 bits of data, 8 bits error-correcting code, all bit-wise parallel) that is coupled by five separate 8-bit buses to a multiplexer 314. The multiplexer, operates in response to the MICRO_OP signals to select each of five 8-bit bytes from the ECC generator 322, and insert it into the 8-bit data for insertion into data fields of write instructions that are communicated to the cells of the memory system W.

Not specifically shown is a parity generator for generating a parity bit over the 13 bits (8 bits of data/address from the multiplexer 314; 1 Token bit; 4 bits of instruction).

Finally, as FIG. 8 illustrates, a clock generator 325 provides the periodic CLK signal that accompanies the instructions/data/address information applied to the memory system MS by the interface controller 300. The clock signal, together with the 5 bits of instruction and Token provided by the output register 306, the 8 bits of data/address from the multiplexer 314, and the parity bit, if used, form the 15 bits that are communicated on the 15-bit bus interconnecting the cells 110 of the memory system MS.

Data read from the wafer scale memory system MS is applied, synchronously, in one byte (8-bits) segments, to a 40-bit IN DATA register 324; each byte is temporarily stored in an 8-bit section of the IN DATA register until all 40 bits are received. The enable input (EN) of the IN DATA register 324 receives the output of a decode unit 325 that, in turn, receives the 4-bit instruction field of the 15-bit address/data that is circulated through various of the cells of the memory system MS. The decode unit 325 functions to enable the IN DATA register 324 when the 15-bit data includes in its -4-bit instruction field the bit configuration for a R_DONE instruction. The clock signal that accompanies the instruction and data/address information, passed from cell to cell, as described above, and is applied to the clock (CK) input to perform the clocking of the IN DATA register 324. If ECC checking is used, the IN DATA register will receive five separate 8-bit bytes (four data, one ECC code).

When five bytes are received by the IN DATA register 324, they are transferred to the host system H, in parallel, via an ECC check unit 326, where the ECC code is stripped therefrom. The ECC check unit 326 checks the data for 1-bit correctable (2-bit detectable) errors, using the one byte of ECC code that accompanies the 32 bits of data. If an error is detected, the ECC check unit 326 will so signify by an error signal (not shown) to alert the host system H that the ECC check indicates that a read operation produced erroneous data, allowing recovery operations to be instituted.

As noted above in connection with the discussion of the architecture of FIGS. 5 and 6, each memory cell stores or provides 4-bit nibbles of data for each write or read operation of each byte of data. Thus, when a request is made by the host system that one or more 32-bit words are to be written, ten different cells of the memory system MS will store the five bytes that make up the 32-bit word and the added ECC code. The interface controller 300 operates much like any controller (e.g., disk controller) to issue the necessary signals to the controlled device (here, the wafer scale integrated memory system) in order to store and retrieve data. The function and operation of the interface controller will become clearer after the following discussion of the operation of a memory cell 110 (FIG. 5A) in the context of an integrated system.

Timing

Before continuing with a description of the use of the instructions to initialize and configured cells structure along the lines of that illustrated in FIGS. 5 and 6, it is advantageous at this time to look at the clocking and timing used by the cell 110. As indicated above, instructions and data are communicated along designated paths formed through a plurality of cells on a 15-bit data and instruction bus (e.g., IN-S, OUT-W, etc.; FIG. 5A) that also carries a clock (CLK) signal. CLK is used by each of the cells 110 to perform the necessary clocking functions of the cell, such as operating the latches that have been previously enabled by prior received instructions and/or data.

In most cases, unless otherwise specifically noted, the latches or other clocked functions are "pre-conditioned" by prior received instructions/data. For example, a load address (LD_ADR) instruction operates, as will be described below, to enabled the CLK signal to (1) set the state of the latch 184 (FIG. 6), as well as to load four bits in the address latch 222. Accompanying the LD_ADR instruction, contained in the 8-bit data field, is one bit that designates the state of the latch 184, and four bits that are to be loaded in the address latch 222. The instruction and data are loaded in the register/decoder 118 with an edge of the CLK signal. The instruction is decoded to produce the appropriate INST decode (here, the INST (LD_ADR) decode). At the same time five bits of the data field are communicated to the latches 184 and 222. The next clocking edge of the CLK signal will effect setting the state of the latch 184 and loading the latch 222 with four bits of information.

Initialization and Configuration

The cell structure and architecture illustrated in, and described with respect to, FIGS. 5 and 6 is preferably formed, many times over, on a semiconductor wafer to form a wafer scale-integrated memory system. So formed, each of the cells, and the memory system, will operate generally as follows: When electrical power is initially applied to the wafer, a power-on circuit (not shown), as mentioned hereinbefore, will operate to clear all registers of the cell 110, in particular the OPEN register 170. Thereby, the OPEN signals, OPEN N, .. ., OPEN_E, as well as the SELECT signal, are placed in a non-asserted state (e.g., OPEN_S and its complement, OPEN_S, are set FALSE and TRUE, respectively). Similarly, the incoming OPEN signals (e.g., OPEN_N', OPEN_E', etc.) are in non-asserted states. The result is that no cell-to-cell communication paths are formed, leaving each of the individual cells isolated from its neighbor cell.

One of the cells 110 of the memory system MS located at (preferably) the periphery of the wafer W, is selected as an input/output (I/O) or "gateway" cell 110G (FIG. 7). Connection is made from the interface controller 300 to the memory system MS by certain of the signal lines of the bus B2 to one of the boundaries N, . . . , W of the selected gateway cell 110G. For example, assume for the sake of this discussion, that connection to a selected gateway cell 110 of a wafer scale memory system MS is via the S boundary of that cell. The CLK-OUT, INSTR, DATA-OUT signal lines from the clock generator 325, the output register 306, and the multiplexer 314 (FIG. 8) are coupled to the 15-bit IN-S bus lines, together with signalling that connects to the OPEN_N' lines so that the boundary can be opened by the interface controller 300. Similarly, the bus B2 will also carry certain of the 15-bit OUT-S bus of the gateway cell to the DATA-IN, and CLK-IN signal lines of the interface controller 300. Of course, it will be understood also that there will be other connections between the interface controller and gateway cell to communicate the other signals, although such connections are not specifically shown in FIG. 8, including the dual-railed boundary OPEN signal lines OPEN_N' (outbound—from the controller) and OPEN_S (inbound to the controller—from the cell).

So connected to the interface controller 300, a dual-railed OPEN signal can be asserted via the OPEN_N' signal lines of the gateway cell 110G to open the boundary S, thereby establishing communication ingress and egress to the cell 110G. Note that if one of the other boundaries W, N, E were selected for access, that boundary would be opened in the same way, but access to the circuitry would circulate through the intermediate connection logic, including connection logic IIIS.

Once a boundary to the cell 110 is opened, the cell can be accessed for configuration and testing. At this stage, a token must be passed to the cell 110 in order to, for example, load the mode register 124, the open register 170, or otherwise configure the cell 110 (FIGS. 5 and 6). Accordingly, 14 bits and clock are applied to the IN-S bus, by the interface controller 300, 13 bits of which will be latched in the register/decoder 118. The instruction field of the latched data will contain a bit-configuration identifying the read done (R_DONE) instruction, and one of lines of the 15-bit bus carries the token bit that is latched by the master flip-flop 161 of the token-passing logic 160 (FIG. 5B). After assuring that all cells in the chain have executed at least one R_DONE instruction, an advance token (ADV_TOKEN) instruction is sent down the chain to transfer the token bit from the master flip-flop 161 to the slave flip-flop 162, the output of which is the STOK signal. Thereby, the TOKEN signal is asserted internal of the cell 110, via the OR gate 164 (FIG. 5A) which receives the STOK signal. The TOKEN signal enables the AND gate 176 (FIG. 6), conditioning the open register 170 to respond to the decode of the open-if-token-present instruction that decodes to the INST signal, OPEN_IF_TOK. Thereby, the open register 170 is enabled for loading. TOKEN, when asserted, also permits the GRP-A and GRP-B registers 180, 182 of the configuration logic 122 (FIG. 6) to be loaded.

The ADV_TOKEN instruction is followed by the load mode (LD_MODE) instruction to load the mode register 124 and/or a load address (LD_ADR) instruction to load the memory address logic 126 (FIGS. 5 and 6). The LD_MODE instruction will be accompanied by an 8-bit data field that identifies which of the four banks of DRAM 130 of that particular cell 110 will be used. For example, two bits of the 8-bit data field, when set in the mode register 124, form the MSB INV signals that function, when asserted, to modify the two most significant row bits from the address latch 222 via the EXCLUSIVE-OR gates 226 and 228 (FIG. 6). The mode register 124, when loaded, also provides the four INHIBIT bits that function to identify whether the cell 110 is one that should be accessed by, in effect, selectively sensing the bit orientation of the most significant bits of the column address via the decode circuit 220, the AND gates 210-216, and NOR gate 200. Depending upon the address applied to the cell 110, the INHIBIT signals can be used to determine if the cell is to be read this particular time.

To load the GRP-A and GRP-B registers 180, 182, the selection latch 184 must be first set by a load address (LD_ADR) instruction to determine which of the GRP-A, GRP-B registers will be loaded. This is done by having the most significant bit (MSB) of the data field that accompanies a LD_ADR instruction specify whether the latch 184 is set (e.g., MSB=TRUE) or reset (MSB=FALSE).

In addition to the bit of the data field accompanying a LD_ADR instruction to designate the state of the selection latch 184, the data field also contains four bits that are coupled from the register/decoder 118, via the 4-bit bus portion 125b of the internal data bus 125, to the address latch 222 of the memory address logic 126 (FIGS. 5A and 6). The four bits are temporarily latched and held to form the two most significant (of ten) bits of row and column addresses. The remaining eight bits of the row and column addresses are supplied later by the RAS and CAS instructions, respectively. The two bits that form the MSBs of the row address specify which bank of the DRAM 130 will be accessed for read or write operations.

Following selection of the desired GRP-A/B register 180, 182, the LD_ADR instruction may be followed by a load group (LD_GRP) instruction to identify the cell 110 as being a member of a predetermined group by the content of the selected GRP- A/B register. If both of the GRP-A/B registers 180, 182 contain different group designations, the group identity of the cell 110 can readily be changed from one to the other merely by changing the state of the selection latch 184 by a LD_ADR instruction.

Once the group identity of the cell 110 are established through loading of the GRP-A/B registers 180, 182, the cell may at any time subsequent be "selected" (i.e., the SELECT signal asserted) by setting the select latch 202 (FIG. 6). SELECT is asserted by sending a GROUP instruction with the data field containing a group identification. Those cells whose GRP-A and GRP-B registers 180, 182 containing that identification, if selected (via the selection latch 184 and multiplexer 192; FIG. 6) will have the MYGRP signal asserted by setting latch 196 via the compare made by the EXCLUSIVE-OR circuit 194 (FIG. 6). SELECT is asserted by a subsequent load address (LD_ADR) instruction. Once selected, the cell is conditioned to respond to any read, write, or configuration instructions that may follow.

Once initialized, the cell 110 can be tested. If testing finds the cell operative (or at least sufficiently operative to be used as a communicative bridge to another cell), the token is moved to a next sequential cell by an ADV_TOKEN instruction (presently held by the latch 160).

The process of entering each cell and performing the necessary initialization and configuration proceeds, under control of the host system H, until all of the cells 110g have been tested and found to be operative or inoperative. Those found not to be operative can be noted in a map maintained by the host system H, and used later to identify paths that can be formed to specific ones of the cells.

"Selecting" a Cell

As will be seen, read and write operations are performed by those cells 110 that have been previously "selected." To be selected, a cell must have its SELECT signal asserted. Cell selection proceeds generally as follows: The cell 110 must first have some identity established by loading at least one of the GRP-A\B registers 180, 182. The latch 184 must then be placed in a state that selects one of the loaded GRP-A/B registers, thereby providing the cell with a specific group identity. Next, a GROUP instruction is issued and communicated among the cells 110 (FIG. 7). The 8-bit data field accompanying the GROUP instruction will contain the group identity of those cells desired to be selected. Each cell receiving the GROUP instruction will have the contents of the selected GRP-A/B register 180, 182 (via the multiplexer 192, under control of the latch 184) compared with the data field accompanying the GROUP instruction by the EXCLUSIVE-OR gates 194. If the particular cell's group identity matches that of the GROUP instruction, the group latch 196 will be set, bringing up the MYGRP signal. The cell is subsequently selected by LD_ADR instructions, designating the memory location for access, that will precede memory access (read or write) instructions.

It should be noted that predetermined numbers of the memory cells capable of being formed on a single wafer can be assigned to different groups by the content of the group registers 180 and 182 (and the state of the latch 184). Such groups can vary in size from one nibble to many nibbles. Grouping permits predetermined numbers of the memory cells to be designated as a group for memory access operations. Separate optional groups can be designated for memory refresh operations or, as will be described below (with respect to the discussion of FIGS. 11A-11C), to identify those memory cells that form a "gateway" to other groups of cells that can be inserted or removed from access paths as desired. The flexibility of this grouping concept will be apparent to those skilled in this art.

Returning to FIG. 6, note that, in addition to the MYGRP signal, the AND gate 198 also receives signalling that operates to establish the particular bank of the cell to be selected for access. Bank selection is established by the INHIBIT signalling from the mode register 124, which is applied to the combinatorial logic of the AND gates 210-216 and OR gate 200. If the particular bank identified by the INHIBIT signalling is designated by the MSBs of the row address, the cell is not selected.

Once selected, the cell will now respond to read and write instructions in the manner described below. When the memory operation for that particular cell is performed, the instruction transmit logic 144 will assert a FINISH that resets the latch 202, de-asserting the SELECT signal, and de-selecting the cell.

Read/Write Operations

Read operations are essentially the same as write operations; the only exception is that data flows from the cells in a read, whereas data flows to the cells in a write. To put it another way, read operations are the mirror of write operations. Accordingly, it will be apparent to those skilled in this art that the following description of memory read operations will apply equally to memory write operations.

As will be seen, a single read instruction ("read both;" READ_B) will read the DRAMs 130 of two cells; each cell will contribute four bits to the 8-bit data field that is ultimately received by the interface controller 300 (FIGS. 7 and 8). Further, as indicated above, it is more efficient to deal in larger chunks of data than a single byte provided by each read instruction. Therefore, strings of read instructions can be issued by the controller to access larger multiples of the cells, and obtain larger chunks of data at a time.

The read both (READ_B) instruction causes the first selected memory cell 110 (i.e., the first cell encountered having the SELECT signal asserted) that receives the instruction to read a 4-bit memory location designated by address information previously loaded in the address latch 222, and the address circuits 132 of the DRAM 130 (by prior LD_ADR, RAS, and CAS instructions). The READ-B instruction causes the $\overline{OE}$ decode to issue from the register/decoder 118, and the data so accessed is communicated, via the multiplexer 142, to the four most significant bit (MSB) positions of the 8-bit data field that is sent on down the chain. (The multiplexer 142 selects the 4-bit output of the DRAM 130 when the signal LEFT is asserted, which is a decode signal derived from the READ_B instruction by the data and instruction register 118

The READ_B instruction is applied to the instruction transmit logic 144, where it is converted to a read next nibble or read remainder (READ_R) instruction. From there it is inserted in the instruction field of the 15-bits of data and instruction that is communicated onto the other cells.

The next selected cell (i.e., with a SELECT signal asserted) to receive the now READ_R instruction will, in the same manner, effect access of the DRAM 130 to issue 4 bits of data that is communicated, via the multiplexer 140 (conditioned to make the selection by the $\overline{LEFT}$, the complement of the LEFT signal, from the mode register 124) to the remaining four bits of the data field. A byte of information has now been accessed.

The READ_R instruction is converted to a read "done" (R_DONE) instruction by the instruction transmit logic 144, to signify that the read operation initiated by the original READ_B instruction is now complete. The requested data now resides in the data field accompanying the R_DONE instruction that will ultimately wend its way back to the controller 300.

Figure 9:
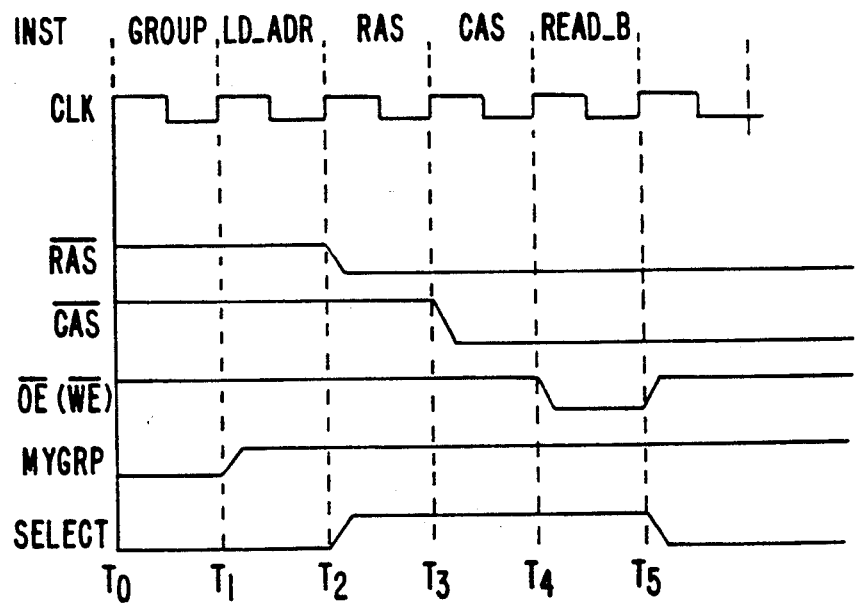
FIG. 9 is a timing diagram, illustrating a read operation.

A representative timing diagram for a read operation is illustrated in FIG. 9, showing the timing for the instructions that must precede a READ_B instruction in order to prepare each memory cell to be accessed. As FIG. 9 illustrates, a GROUP instruction is received and latched by the data and instruction latch 118 at time $T_0$ (with the rising or LOW to HIGH transition of the CLK signal). The instruction is decoded, and the resultant assertion of the INST (GROUP) decode is applied to the data enable (DE) of the latch 196 (FIG. 6). At the same time the group ID specified by the 8-bit data field that accompanied the GROUP instruction is communicated from the data and instruction latch 118 to the EXCLUSIVE-OR circuit 194. If the content of the selected GRP-A/B register 180, 182 (depending upon the state of selection latch 184) matches the group ID, the MYGRP signal is asserted by setting the group latch 196. Note that the MYGRP signal is brought HIGH on the rising edge of CLK at time $T_1$.

The GROUP instruction is followed by a LD_ADR instruction which, at time $T_1$, is latched in the register/decoder 118. The LD_ADR instruction includes in its associated data field the two most significant bits (MSB) of the desired row address, and the two MSBs of the column address of the memory locations desired to be read. These four bits of the data field are, after being latched by the register/decoder 118, communicated to the address latch 222 of the memory address logic 126 by the 4-bit portion 125b of the internal data bus 125.

At time $T_2$ the row and column MSBs are set in the memory address logic 126, the SELECT signal goes HIGH if the MYGRP signal is asserted, and the next instruction in sequence, here a RAS instruction, is set in the register/decoder 118. The data and instruction latch 118 contains logic (not shown) that pre-decodes the RAS (and the CAS) instruction, so that the responsive decode, $\overline{RAS}$, is asserted almost as soon as RAS is received. The data field of the RAS instruction contains the eight bits of a row address which will be combined with two of the bits contained in the address latch 222 to form the 10-bit row address. The assertion of $\overline{RAS}$ loads, if SELECT is HIGH, load the 10-bit row address into the memory address circuits 132 of the DRAM 130.

The RAS instruction is followed by the CAS instruction, with an accompanying eight bits of column address in the data field. As with the RAS instruction, the CAS instruction is pre-decoded to produce the $\overline{CAS}$ signal to cause the eight bits of column address (from the register/decoder 118) and the two MSBs from the address latch 222 to set the 10-bit column address in the memory address circuits 132 of the DRAM 130 of the selected cells.

The selected cells are now conditioned for read operations. Sequences of read both instructions (READ_B) will now follow, each READ_B instruction being converted to a READ_R instruction and ultimately to a R_DONE, as described above. The data field of the resultant R_DONE instruction contains the eight bits of data read from two of the cells. The number of read (READ_B) instructions in a sequence will depend upon the number of bytes to be read at any one time. For example, if a 32-bit (plus ECC) word only is read, five sequential READ_B instructions are needed, each READ_B instruction resulting in an R_DONE with one byte of data read. It should be evident that the most expeditious method of reading one or more words of data would be to use sequences of read instructions without having to resort to configuration instructions between the words. Thus, it would be preferred to conduct read operations by first configuring the memory-containing cells holding the data to be obtained as preferable one, or some small number of, groups. Preferably, each accessed word would be retrieved from 10 memory-containing cells configured as one group.

Figure 10B:
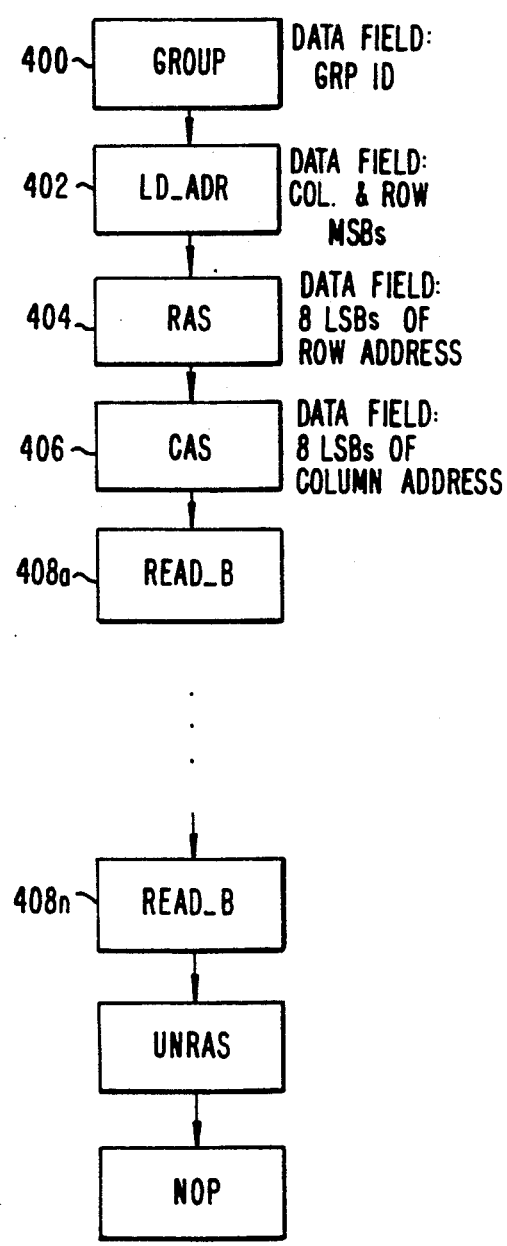
FIGS. 10A and 10B are flow diagrams illustrating exemplary instruction sequences for read and memory refresh operations, respectively, of a wafer scale memory system constructed in accordance with the teachings of the present invention.
Figure 10A:
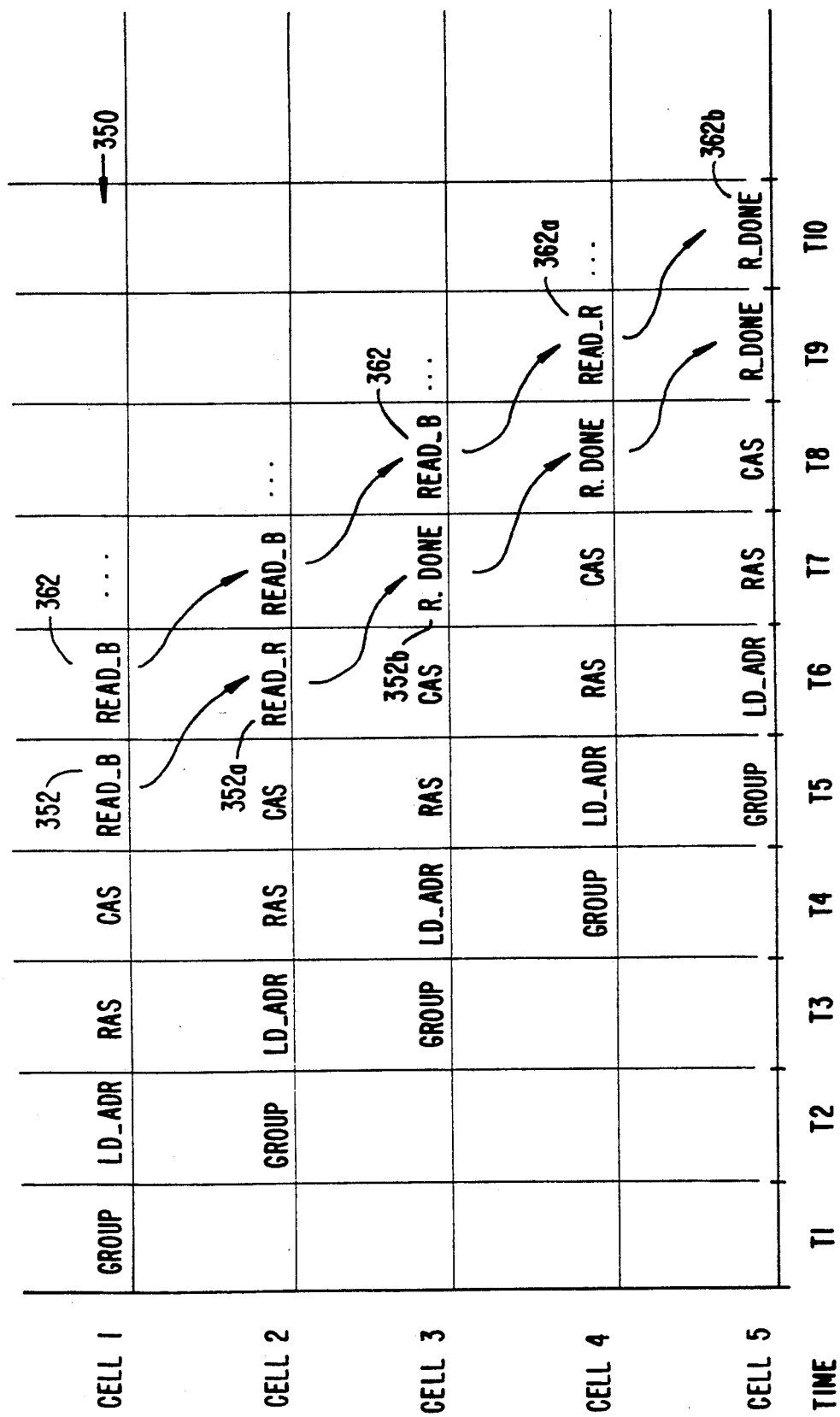

This concept of sequences of read instructions is shown by the diagrams of FIGS. 10A and 10B, each of which diagrammatically illustrates the instruction flow through a previously established, logically-connected string of memory cells 110 for reading a certain number of those memory cells. The instruction flow operates to select certain of the memory cells for access, and shows how that access is perform by multiple reads.

Turning first to FIG. 10A, assume for the discussion of this Figure that the group of the memory cells 110 carried by a wafer W (FIG. 7) form a linear path whose entry and exit point is the memory cell 110G. Included in that linear configuration of cells 110 are those illustrated in FIG. 10A, CELL 1, CELL 2, CELL 3, CELL 4 and CELL 5. Assume further that CELL 1, . . . , CELL 5 form at least a portion of a group of N memory cells desired to be accessed (e.g., information read therefrom). Thus, an instruction stream 350 (FIG. 10A) that will include header instructions (GROUP, LD_ADR, RAS, and CAS) will need to be communicated to the memory cells 110 that form the linear path. The header instructions are followed by a number (N/2) of READ_B instructions for accessing 4 bits of data from each of the desired N memory cells 110, each memory cell supplying 4 bits. (Each READ_B instruction will operate to effect a read of a memory location from each of two memory cells 110; hence, only N/2 READ_B instructions are needed to access N memory cells—to obtain N/2 8-bit bytes of data.)

The header instructions operate to condition (i.e., select) those memory cells 110 of the linear string to respond to read/write instructions. As explained above, those memory cells having their respective SELECT signals asserted (i.e., flipflop 202 set) are thereby conditioned to respond to the first read (READ_B or READ_R) or write (WRITE_B or WRITE_R) instructions received. Completion of a memory cell's response to the received READ_B (or READ_R) instruction will deassert the SELECT signal, de-conditioning, or desensitizing if you will, the memory cell from any further response to received read or write instructions.

As FIG. 10A illustrates, CELL 1 receives the header instructions, GROUP, LD_ADR, RAS, and CAS instruction during the time periods T1, T2, T3 and T4. Similarly, the CELL 2 receives the header instructions during time periods T2, . . . , T5, and so on. The header instructions cause the SELECT signal to be asserted in each of the cells CELL 1, . . . , CELL 5 in the manner described above with respect to FIG. 9.

With the clock that initiates the time period T5, CELL 1 will load the READ_B instruction 352 into the data and instruction/decode register 118. During the time period T5, the DRAM 130 is accessed for a four-bit nibble that is inserted in the high order four-bit position of the data field of the read instruction. At the same time, the bit configuration of the READ_B instruction is modified to become a READ_R instruction by the instruction transmit logic 144 (FIG. 5A).

So modified, and with the high order four bits of the accompanying data field containing the four bits of data accessed from the CELL 1, a READ_R instruction 352a is communicated from the CELL 1 to the next cell in line, CELL 2.

With the same clock that effects communication of the READ_R instruction 352a to CELL 2, the instruction transmit logic 144 of the CELL 1 asserts a FINISH signal that resets flipflop 202 (FIG. 6) to deassert the SELECT signal. Receipt of further read instructions, such as READ_B instruction 362, will generate no activity on the part of CELL 1—until the SELECT signal is again asserted.

CELL 2, on the other hand now receives the READ_R instruction 352a and, during the time period T6 performs essentially the same activity as did CELL 1 when it responds to receipt and decoding of the READ_B instruction 352. Four bits of data are read from the DRAM 130 of that cell and placed in the four low-order bit positions of the data field; the READ_R instruction 352a is changed to a R_DONE instruction 352b; and the result (i.e., what is now the R_DONE instruction 352b and the eight bits of data accessed from CELL 1 and CELL 2) communicated to CELL 3. The SELECT signal of CELL 2 is deasserted.

The R_DONE instruction 352b operates as a no-operation (NOP) instruction. Thus, when the R_DONE instruction 352b is received by CELL 3, (as well as CELL 4 and CELL 5), nothing is done except to pass it through and on its way to the next successive cell in line. Ultimately, the R_DONE instruction 352b is communicated along to the controller 300 and the eight bits of data from CELL 1 and CELL 2 retrieved.

The READ_B instruction 362, however, is the first read (i.e., non R_DONE) instruction received by CELL 3 while its SELECT signal is asserted and, therefore, its DRAM 130 is accessed in the manner described above and the instruction changed to a READ_R instruction 362a. Similarly, the READ_R instruction 362a received by CELL 4 from CELL 3 is acted upon by CELL 4 in the same manner, resulting in an R_DONE instruction 362b that is received by CELL 5.

The two R_DONE instructions 352b and 362b have no effect on CELL 5 and are disregarded; they are merely passed on, their data fields containing the data accessed from CELL 1, . . . , CELL 4 in the manner described above.

Turning now to FIG. 10B, the memory-containing cells of the memory system MS (FIG. 7) are shown being selected for reading by the steps denoted by the reference numerals 400–406 in the manner described above. The last of the setup instructions, CAS in step 406 is followed by a number (N) of READ_B instructions at steps $408_a$ through $408_n$, each in turn generating subsequent READ_R and R_DONE instructions; each of the R_DONE instructions will contain one byte of data read from two of the selected cells. The number N (i.e., the number of READ_B instructions) depends upon the number of bytes desired and identifies the number of cells forming a group. The read (or write) sequence preferably concludes with a NOP instruction (to satisfy the timing requirements of DRAM 130) which can be implemented by an R_DONE, W_DONE, or (if no Token is located in any of the cells being accessed) an OPEN_IF_TOK instruction.

The ability to "select" certain of the cells 110 (FIG. 7) to the exclusion of others provides the capability of memory system access not believed to be heretofore available in prior wafer scale integrated memory systems. Prior such systems tended to create a "spiral" of tested and operable cells. Access to any one or groups of cells required data and instructions to traverse all cells of the spiral. Effective memory access, therefore, tended to be burdened with an undesirable access time. The present invention provides a memory access capability that can reduce such access time overhead.

Figure 11A:
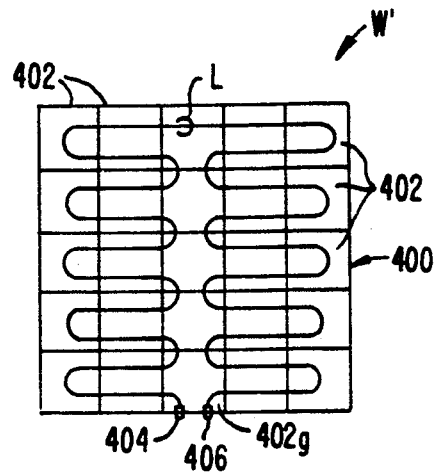
FIGS. 11A, 11B, and 11C illustrate selected configurations available to the present invention.
Figure 11B:
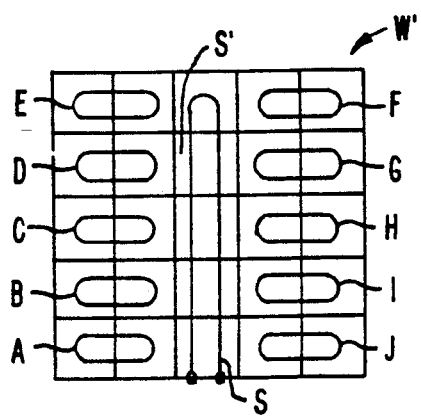
Figure 11C:
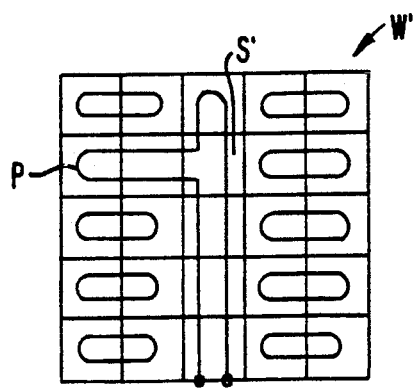

Referring now to FIGS. 11A–11C, a memory system 400 is simplistically shown (for illustrative purposes) as comprising a wafer W' having formed thereon a plurality of memory cells 402, including a gateway memory cell 402g, constructed in accordance with the teachings of the present invention. The gateway cell 402g is preferably located at the periphery of the wafer 400, and is selected as the cell providing communication ingress and egress to the other cells 402 on the wafer 400 via input and output terminal connections 404 and 406, respectively. Assume (as above) that the input and output terminal connections 404 and 406 are located at the south (S) boundary of the gateway cell 402g. Connection would be made, for example, from an interface controller (such as interface controller 300, FIGS. 7 and 8) to the IN-S and OPEN_N' signal lines (FIG. 5A) of the cell 402g to permit data and instructions to be communicated to the cells 402. The output terminal 406 would provide connection for the OUT-S and OPEN_S signal lines of the gateway cell 402g.

The wafers 402, beginning with the gateway cell 402g, would then be sequentially opened and tested, using a generic algorithm along the lines as described above, ultimately forming a linear array (L—FIG. 11A) signal communication path from the input terminal connection 404 to the output terminal 406 of cells tested and operable. Using an appropriately programmed data processing system to drive, for example, the controller 300 to communicate the necessary instructions and data to the wafer and the cells contained thereon, a mapping can be developed of memory-containing cells found to be sufficiently operable.

Note, however, that to read information from any one of the cells 402 would produce a latency of 25; that is, the read instruction and resultant data would travel through all 25 cells before appearing at the output connection terminal 406.

However, using the teachings of the present invention a more efficient method of accessing the cells 402 can be done. The cells 402 and 402g found to be operable can be assigned to specific groups, using the ability to establish a group identity for each cell by loading the GRP-A/B registers 180, 182, with group identity information. Specific ones of the cells can then be "selected" to perform various operations by follow-up GROUP instructions to make appropriate selection. Thus, for example, and as diagrammatically and simplistically illustrated in FIG. 11B, certain of the cells 402 can be configured to form a group of cells called a "stem" S. The remaining cells can be configured as differing groups A, . . . , J, forming the "leaves" adjoining the stem S.

Then, for example, as FIG. 11C illustrates, the group D cells (or any other of the leaves) may be accessed as follows: The access to the group D cells is cell S'. Thus, cell S' is put in a "selected" state, so that its configuration register can be loaded for access to the neighbor cell 402 that provides access to the group D cells. Ultimately, the path (P) can be established, providing access to the cells of group D via the cells of the stem group S. Note now that the latency is reduced from 25, encountered in the linear array configuration (FIG. 11A), to 7.

Of course it will be appreciated that any leaf or group of leaves selected as described above can also include portions of the stem S. Different access alternatives would switch between the configurations illustrated in FIGS. 11B and 11C; that is depending upon which leaf or leaves contain data desired to be accessed (or have memory locations that are available for use), certain of the leaves A, . . . , J will form, time to time, a part of a string with the stem S (as did leaf P, as illustrated in FIG. 11c), while others will not.

In summary, there has been shown and discussed a wafer scale integrated memory system comprising a plurality of substantially identically memory-containing cells formed on a single semiconductor substrate. Each cell further includes logic operable to place the cell in various operative states, including: a first state at power up that isolates the cell, insofar as data and control signals are concerned, form its neighboring cells, but responsive to certain of a number of instructions capable of opening data and control signal communicative paths to selected neighbor cells; a second state in which the is responsive to other of the number of instructions, but not memory access instructions; and at least a third state, in which the cell is responsive to memory access instructions. The memory access logic is structured so that a memory access (i.e., a read or write of data) will cause the cell to move from the third state to the second state, requiring further instructions to place the cell in the third state so that it is responsive again to memory access instructions.

It should be appreciated that the FIGS. 11A–11C depict a extremely simplistic configuration the leaf/-stem cells for ease of illustration only. In reality, the leaves A, . . . , J, as well as the stem S, will themselves most likely be serpentine arrangements of cells.

There has also been disclosed a cell configuration technique for use with a wafer scale integrated memory system constructed with memory cells of the present invention that reduces memory access latency heretofore encountered with prior wafer scale memory systems.

While this has been a full and complete disclosure of the invention, including mention and illustration of various alternate embodiments of the invention, it will be evident to those skilled in this art that various other alternatives can be employed using the teachings herein provided without departing from the true scope and spirit of the invention, which is set forth in the accompanying claims.

What is claimed is:

1. A wafer scale integrated memory system, comprising:
    a plurality of memory cells formed on a semi-conductor wafer, each of the memory cells including:
        (a) connection means for selecting a communication path between such memory cell and an adjacent memory cell for communicating data and instructions, the instructions including first and second control instructions;
        (b) memory means coupled to the connection means for storing data;
        (c) first circuit means responsive to the first control instructions for placing such memory cell in a first state;
        (d) second circuit means operable in the first state to respond to the second control instructions for accessing the memory means to store or retrieve data from the memory;
    whereby selected ones of the plurality of memory cells are placed in the first state for responding to the second control instructions.

2. The wafer scale integrated memory system of claim 1, wherein the first circuit means includes temporary storage means operable to receive and hold information signifying the memory cell as being a member of a predetermined group of the plurality of memory cells.

3. The wafer scale integrated memory system of claim 2, wherein the first control instructions include data identifying the selected ones of the plurality of memory cells to be placed in the first state, and wherein the first circuit means includes means coupled to the temporary storage means for comparing the signifying information and the identifying data in the first control instructions for placing such memory cell in the first state.

4. The wafer scale integrated memory system of claim 1, wherein the connection means including means responsive to receipt of an open signal from the adjacent memory cell to select the communication path.

5. The wafer scale integrated memory system of claim 1, wherein each of the memory cells includes power on means for placing the connection means in a non-communication state with the adjacent memory cell.

6. The wafer scale integrated memory system of claim 1, including means operable in the first state to respond to predetermined ones of the second control instructions to remove such memory cell from the second state upon completion of the access of the memory means.

7. A wafer scale integrated memory system formed on a semiconductor wafer, the memory system including a plurality of memory cells, each of the memory cells comprising:
   connection means for selectively establishing a communication path for data and instructions between a one of the plurality of memory cells and an adjacent one of the memory cells formed on the semiconductor wafer;
   memory means for storing data;
   select means coupled to the connection means for placing the one memory cell in a first state in response to first ones of the instructions;
   circuit means coupling the memory means to the connection means and to the select means for responding, when the one memory cell is in the first state, to second ones of the instructions to access the memory means for storing or retrieving data; and
   means for communicating data between the memory means and the connection means.

8. The memory system of claim 7, wherein the select means of each of the memory cells includes means responsive to third ones of the instructions to provide the memory cell with a first identification.

9. The memory system of claim 8, wherein the first instructions include indicia identifying those memory cells to be placed in the first state, and the select means including means coupled to receive the first identification and the indicia of the first instructions for placing the memory cell in the first state when the first identification and the indicia match.

10. The memory system constructed from a wafer scale integration of a plurality of memory cells formed on a semiconductor wafer, each of the memory cells comprising:
    N boundaries forming a periphery of the memory cell, each boundary separating the memory cell from a neighbor memory cell formed on the semiconductor wafer adjacent such boundary, each boundary having associated therewith input and output bus means for communicating data and instruction signals, including memory instruction signals, between the neighbor memory cell and the memory cell;
    logic means, including memory means, for storing data in, and accessing data from, the memory means in response to the memory instruction signals;
    connection means associated with each of the N boundaries for selectively communicating data between the memory cell and the neighbor memory cell adjacent such boundary;
    circuit means coupled to the connection means for establishing a data path across at least one of the N boundaries for communicating the data and instruction signals; and
    means for selecting predetermined ones of the memory cells for response to the memory instruction signals.

11. A digital system formed on an integrated circuit wafer, the system including a plurality integrated circuit cells, each of the integrated circuit cells comprising:
    a plurality of boundaries circumscribing the cell, each of the boundaries having a neighbor cell formed on the integrated circuit wafer adjacent such boundary;
    selection means for each boundary to establish a communication path for receiving information from the neighbor cell formed adjacent one or more of the boundaries;
    means coupled to the selection means for each boundary for generating an open signal to cause the selection means to establish the information communication path with the neighbor cell adjacent at least one of the boundaries;
    logic means coupled to the selection means for receiving the information and for performing a digital operation; and
    first circuit means for placing the cell in a first state for communicating information between a first neighbor cell adjacent one of the plurality of boundaries and a second neighbor cell adjacent a second of the plurality of boundaries, the first circuit means including second circuit means for placing the cell in a second state responsive to the information from the neighbor cell to perform the digital operation.

12. The digital system of claim 11, wherein the information includes instructions, and the logic means includes means for interpreting the instructions for performing the digital operation.

13. The digital system of claim 11, each cell including means for placing the cell in a first state for communicating the information between a first neighbor cell adjacent one of the plurality of boundaries and a second neighbor cell adjacent a second of the plurality of boundaries and the logic means being unresponsive to the information.

14. The digital system of claim 13, the means for placing including means for placing the cell in a second state wherein the logic means is responsive to the information to perform the digital operation.

15. The digital system of claim 14, wherein the information includes data and the logic means includes memory means for selectively storing the data.

16. The digital system of claim 15, wherein the information includes instructions, the logic means being operable in the second state to respond to certain ones of the instructions to cause the memory means to perform memory operations.

17. A memory system formed by a plurality of memory cells formed on a semiconductor wafer, each of the memory cells comprising:
    N boundaries forming a periphery of the memory cell, each boundary separating the memory cell from a neighbor memory cell formed on the semiconductor wafer adjacent such boundary, each boundary having associated therewith input and output bus means for communicating data and instructions signals, including memory instruction signals, between the neighbor memory cell and the memory cell;

logic means, including memory means, for storing and accessing data in the memory means in response to memory instructions;

a plurality of connection means each associated with a corresponding one of the N boundaries for selectively establishing a communication path between the memory cell and the neighbor memory cell adjacent such boundary;

circuit means coupled to the connection means for selecting at least one of the plurality of connection means to establish the corresponding communication path across at least one of the N boundaries for communicating the data and instruction signals; and means responsive to certain of the instructions for placing the memory cell in a first state responsive to the memory instructions.

18. The memory system of claim 17, wherein the memory instructions include data.

19. The memory system of claim 17, wherein the memory instructions include store data instructions, together with data to be stored, and information indicative of execution of the store data instructions, the logic means including means for storing the data in the memory means, and for modifying the store memory instruction to indicate execution of the operation.

20. The memory system of claim 17, wherein the memory instructions include a read data instruction, and wherein the logic means includes means for modifying the read data instruction to (1) include the data read from the memory means and (2) indicate execution of the read data instruction.

21. The memory means of claim 20, wherein, while in the first state, the logic means includes means for disregarding the memory instructions when the information indicative of execution indicates that the first and the second data portions are contained in such memory instruction.

22. The memory system of claim 17, wherein the memory cells are unresponsive to the memory instructions when not in the first state.

23. The memory system of claim 22, the logic means including means responsive to first ones of the memory instructions to store the data contained in the first ones of the memory instructions in the memory means when in the first state.

24. The memory system of claim 22, wherein the logic means includes means responsive to first ones of the memory instructions to receive the data from the memory means and to merge the data into such first ones of the memory instructions when in the first state.

25. The memory system of claim 222, wherein the memory means stores a portion of the data contained in the memory instruction.

26. The memory system of claim 25, wherein the memory instructions include data having first and second data portions and information indicative of storage of the first or the second data portions, the logic means including means for storing the first data portion when the information indicates the first data portion has not been stored, and for storing the second data portion when the information indicates the first data portion has been stored but the second data portion has not been stored, and means for modifying the memory instruction to indicate storage of the first or the second data portion.

27. The memory means of claim 26, wherein, while in the first state, the logic means includes means for disregarding the memory instructions when the information indicative of execution indicates that the first and the second data portions have been stored.

28. The memory system of claim 27, wherein the memory cell provides a portion of the data contained in the memory instruction.

29. The memory system of claim 27, wherein the data comprises first and second data portions and the information indicative of execution being indicative of placement of the first or the second data portions in the memory instruction, the logic means including means for modifying the memory instruction to include the first data portion when the information indicative of execution indicates the first data portion is not contained in the memory instruction, and for modifying the memory instruction to include the second data portion when the information indicative of execution indicates the first data portion in contained in the memory instruction but the second data portion is not so contained, and means for modifying the memory instruction to indicate containment in the memory instruction of the first or the second data portions.

* * * * *